(12) United States Patent
Nakamura

(10) Patent No.: US 7,549,222 B2
(45) Date of Patent: Jun. 23, 2009

(54) METHOD OF PRODUCING WIRING BOARD

(75) Inventor: Naoki Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 56 days.

(21) Appl. No.: 11/338,828

(22) Filed: Jan. 25, 2006

(65) Prior Publication Data

US 2006/0118329 A1 Jun. 8, 2006

Related U.S. Application Data

(62) Division of application No. 10/949,209, filed on Sep. 27, 2004, now Pat. No. 7,317,166.

(30) Foreign Application Priority Data

May 10, 2004 (JP) .............................. 2004-140253

(51) Int. Cl.
*H01K 3/10* (2006.01)
*H01R 12/04* (2006.01)
(52) U.S. Cl. .............................. 29/852; 29/825; 29/848
(58) Field of Classification Search .................... 29/825, 29/848, 852, 846
See application file for complete search history.

(56) References Cited

U.S. PATENT DOCUMENTS

| | | | | |
|---|---|---|---|---|
| 5,421,083 A | * | 6/1995 | Suppelsa et al. | 29/852 |
| 5,689,091 A | * | 11/1997 | Hamzehdoost et al. | 174/255 |
| 5,949,030 A | * | 9/1999 | Fasano et al. | 174/262 |
| 6,787,710 B2 | * | 9/2004 | Uematsu et al. | 174/261 |
| 7,125,810 B2 | * | 10/2006 | Muta et al. | 438/758 |
| 7,168,164 B2 | * | 1/2007 | Jessep et al. | 29/852 |
| 7,316,063 B2 | * | 1/2008 | Farnworth et al. | 29/846 |
| 2002/0179332 A1 | * | 12/2002 | Uematsu et al. | 174/262 |
| 2004/0069529 A1 | * | 4/2004 | Oggioni et al. | 174/262 |
| 2006/0118329 A1 | * | 6/2006 | Nakamura | 174/260 |

FOREIGN PATENT DOCUMENTS

| | | |
|---|---|---|
| JP | 01-168093 A | 7/1989 |
| JP | 2002-353588 | 12/2002 |
| JP | 2003-204209 A | 7/2003 |
| JP | 2003-243783 A | 8/2003 |
| JP | 2003-243831 | 8/2003 |

OTHER PUBLICATIONS

CN 200410085189.5 Office Action dated Aug. 11, 2006.
Japanese Notification of Reason for Refusal dated Mar. 24, 2009, issued in corresponding patent application No. 2004-140253.

* cited by examiner

*Primary Examiner*—C. J Arbes
(74) *Attorney, Agent, or Firm*—Westerman, Hattori, Daniels & Adrian, LLP

(57) ABSTRACT

A wiring base board and a method of producing thereof relate to a wiring base board of a multilayer structure, and make it possible to perform various kinds of transmission modes such as differential transmission at via parts. For this wiring base board, an insulating substrate is used. The wiring base board has a first via hole part which is formed in the insulating substrate and provides a plurality of circumferential face parts, and a plurality of second via hole parts, forming concentric circles with the circumferential face parts, which are formed in the first via hole part through an insulator. By this, a differential wiring structure and coaxial structure parts are constituted.

3 Claims, 30 Drawing Sheets

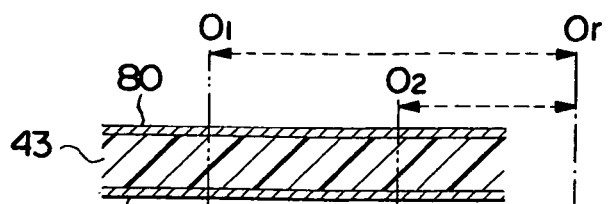
FIG.15A
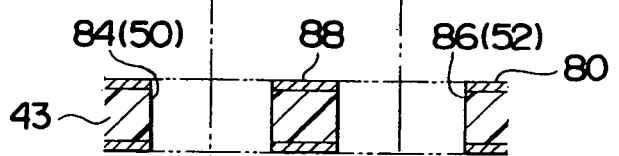
FIG.15B
FIG.15C
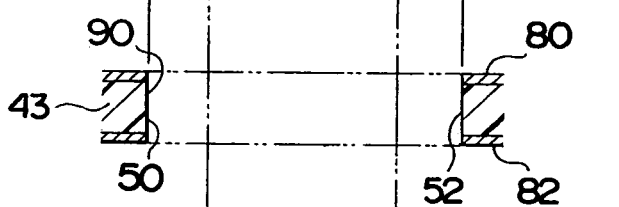
FIG.15D
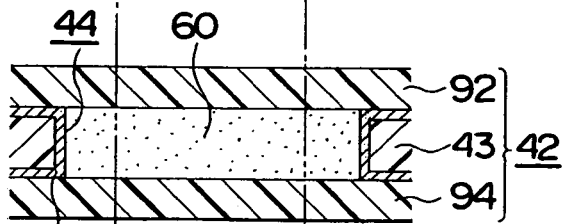
FIG.15E
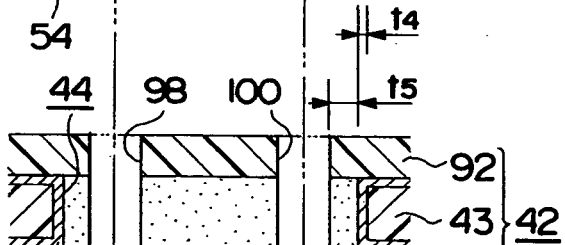
FIG.15F
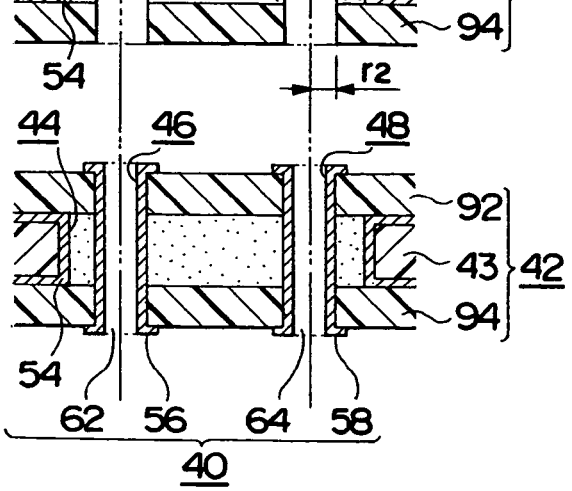

METHOD OF PRODUCING WIRING BOARD

CROSS-REFERENCE TO RELATED APPLICATIONS

This application is a Divisional application of application Ser. No. 10/949,209, filed Sep. 27, 2004, the entire disclosure of which is hereby incorporated by reference.

BACKGROUND OF THE INVENTION

1. Field of the Invention

The present invention relates to a multilayer wiring base board, and, in more detail, relates to a base board constitution having a coaxial structure with plural cores, a method of producing thereof and an electronic device.

2. Description of the Related Art

For a wiring base board which transmits a high-speed signal, differential transmission by means of paired wiring is used as transmission system which is strong in an external noise. In case in which a coaxial via intended for conventional single transmission is used for such a differential transmission system, a differential structure is not obtained at this via part.

For example, in connection with this coaxial via structure, an explanation is given by referring to FIG. 1 through FIG. 3. FIG. 1 is a drawing showing a part of an upper face of a base board which has the coaxial via structure, FIG. 2 is a longitudinal sectional view of a part taken along line II-II of FIG. 1, and FIG. 3 is a transverse sectional view of a part taken along line III-III of FIG. 2. In this coaxial via structure, a via hole part 4 is formed in a wiring base board 2 as a single signal hole. Inside of this via hole part 4, a GND (grounded conductor) wall 6 is provided, and a via conductor part 10 which constitutes a via core forming a coaxial structure with the GND wall 6 through an insulator 8 is also provided. The via conductor part 10 is connected to a wiring pattern 12 of an upper face side of the wiring base board 2, and is also connected to a wiring pattern 14 of a lower face side of the wiring base board 2.

In cases where a guard pattern is provided in such a coaxial via structure, an explanation is given by referring to FIG. 4 through FIG. 6. FIG. 4 is a drawing showing a part of an upper face of a base board which has a coaxial via structure, FIG. 5 is a longitudinal sectional view of a part taken along line V-V of FIG. 4, and FIG. 6 is a transverse sectional view of a part taken along line VI-VI of FIG. 5. In this coaxial via structure, a GND guard pattern part 16 which surrounds the wiring pattern 12 is formed in an upper face part of the wiring base board 2. This GND guard pattern 16 and the GND wall 6 are electrically connected by forming a plurality of non-through holes 18 in a lower face side of the GND guard pattern part 16 and providing a conductor part 20 inside each non-through hole 18.

In connection with a wiring base board which uses such a coaxial via structure for differential wiring, an explanation is given by referring to FIG. 7 and FIG. 8. FIG. 7 is a differential wiring structure which does not use a guard pattern, and FIG. 8 is differential wiring which uses a single-core coaxial via part. Differential wiring 26 is constituted by a pair of via hole parts 22 and 24. Wiring patterns 23, 25, 27 and 29 which constitute the differential wiring are connected to each of the via hole parts 22 and 24. In the differential wiring 26, one signal is inverted into a positive phase (+) side and an opposite phase (−) side and is transmitted as two signals, and, by both of them having an influence on each other through electromagnetic coupling, the improvement of a transmission characteristic is given. However, as shown in FIG. 8, each of the via hole parts 22 and 24 is surrounded by the GND wall 6, and thereby, each of coaxial via hole parts 31 and 33 is constituted. In the coaxial via hole parts 31 and 33 of a constitution like this, even if the two via hole parts 22 and 24 are parallel conductors, the differential wiring is not obtained because the electromagnetic coupling is interrupted by the GND wall 6. That is, the signal transmission of the coaxial via hole parts 31 and 33 is nothing but single-wire transmission.

As to patent documents regarding the signal transmission of a via part like this, there are the Japanese Patent Laid Open Publications No. 2002-353588, No. 2003-243831 and so on.

The publication No. 2002-353588 discloses a wiring base board which uses differential wiring. According to this wiring base board, in relation to a through hole (a via hole part) which transmits a differential signal on a multilayer wiring base board, a first through hole is formed. Further, an insulator part is formed by filling the first through hole with an insulating resin, and a pair of second through holes which transmits the differential signal is formed in the insulator part.

Further, the publication No. 2003-243831 relates to a wiring base board and its producing method, and discloses the following wiring base board. This wiring base board comprises a metal core substrate having a surface and a back face, an elliptic (non-circular) through hole formed in the metal core substrate, and a pair of through hole conductors arranged in the through hole though an insulating material. The through hole is an elliptic shape which surrounds the pair of through hole conductors, and a distance between an inner wall of the through hole and an outer circumferential part of an opposing through hole conductor out of the through hole conductors is made non-uniform.

By the way, the wiring base board disclosed in the publication No. 2002-353588 has the following constitution. As shown in FIG. 9, a large-diameter conductor part 32 is formed in a via hole part 30, and conductor parts (plating parts) 36 and 38 are provided inside the conductor parts 32. Further, by providing an insulator 34 between these conductor parts, differential wiring is given. In the publication No. 2002-353588, it is mentioned to be a coaxial structure. However, a center Oa of the conductor part 32, a center Ob of the conductor part 36 and a center Oc of the conductor part 38 are set at different positions. Assuming that a distance (radius) from center Ob or Oc to outer face part of the conductor part 36 or 38 is r, a distance R (=R1, R2, R3, ... ) from each of the centers Ob and Oc to inner face part of the conductor part 32 differs by means of an angle θ (R1≠R2≠R3 ≠ ... ). That is, a distance between an outer circumferential face part of the conductor part 36 or 38 and an inner circumferential face part of the conductor part 32 differs by an angle. It is not said that the conductor part 32 and the conductor parts 36 and 38 differing in a center position as described above are the coaxial structure.

Furthermore, in the wiring base board disclosed in the publication No. 2003-243831, the metal core substrate provides the elliptic through hole and nothing more. Since the core substrate is a metal plate, a connecting structure between a surface and a back face of the base board is restricted. Further, if the metal plate is made thick, it becomes heavy, and a restriction is placed on multilayer wiring within a width of a thickness of the metal plate.

SUMMARY OF THE INVENTION

The present invention relates to a wiring base board of a multilayer structure, and objects of the present invention are to provide a wiring base board which enables various kinds of transmission modes of differential transmission and so on at a via part, a method of producing thereof or an electronic device.

In order to attain the above objects, a wiring base board which is the first side of the present invention is a constitution which comprises an insulating substrate, a first via hole part that is formed in this insulating substrate and has a plurality of circumferential face parts, and a plurality of second via hole parts, forming concentric circles with the above-mentioned circumferential face parts, that are formed in the first via hole part through an insulator, wherein parts forming the above-mentioned concentric circles are made into coaxial structure parts. According to a constitution like this, by providing the plurality of second via hole parts of concentric circles with the plurality of circumferential face parts inside the single via hole part which has the plurality of circumferential face parts at an inner face, it is possible to make the first and the second via hole parts coaxial structures at the parts forming the concentric circles. Along with this, it is possible to perform differential transmission between the plurality of the second via hole parts formed inside the first via hole part, and stability against an external noise may be heightened.

In order to attain the objects, the wiring base board of the present invention may also be constituted so that the wiring base board further comprises a first conductor part formed in an inner circumferential face of the above-mentioned first via hole part, and a plurality of second conductor parts formed in the above-mentioned second via hole parts, wherein the second conductor parts opposite to the first conductor part on the above-mentioned circumferential face parts of the first via hole part is constituted as the coaxial structure parts. According to a constitution like this, the wiring base board has the plurality of the second via hole parts forming the concentric circles with the plurality of circumferential face parts inside the single via hole part which provides the plurality of circumferential face part at its inner face, and, by the first conductor part formed in an inner face of the first via hole part and the plurality of second conductor parts formed in the second via hole parts, the coaxial structures are constituted at the parts forming the concentric circles. Further, by parallel lines which are constituted by the plurality of second conductor parts of the second via hole parts formed inside the first via hole part, differential transmission becomes possible.

In order to attain the above objects, the above-mentioned insulator inside the coaxial structure parts may also be set to the same thickness (t5). According to a constitution like this, the accuracy of a coaxial structure is heightened by the thickness of the insulator. Further, in order to attain the above objects, the above-mentioned insulator inside the coaxial structure parts may also be constituted by an organic material or an inorganic material. Further, the second via hole parts at insides of those holes may also be made into an air core, or may also be made into a non-air core by filling either a conductive material or a non-conductive material. Furthermore, in order to attain the above objects, a guard pattern part that surrounds the above-mentioned second via hole parts may also be provided.

In order to attain the above objects, the above-mentioned first conductor part may also be made into a grounded conductor. According to a constitution like this, since the first conductor part forming the coaxial structures is grounded, the coaxial structures in which the second conductor parts are surrounded with the grounded conductor through the insulator are obtained.

In order to attain the above objects, the wiring base board may also be constituted so that a guard pattern part surrounding the above-mentioned second via hole part is provided, so that the above-mentioned second conductor parts are connected to the guard pattern part. Further, the above-mentioned first and second conductor parts may also be constituted by a metal material or a conductive paste.

Further, in order to attain the above objects, the wiring base board of the present invention may also be constituted so that the wiring base board has a conductor connecting between the above-mentioned guard pattern part surrounding the second via hole parts and the above-mentioned first conductor part formed inside the first via hole part, and a penetration part in which this conductor is provided.

In order to attain the above objects, a producing method of a wiring base board which is the second side of the present invention is a constitution which includes a process that forms a plurality of holes in an insulating substrate and forms a first via hole part providing a plurality of circumferential face parts at an inner face, a process that fills an insulator into the first via hole part, and a process that forms a plurality of the second via hole parts forming concentric circles with the above-mentioned circumferential face parts by using central axes, which are set to form the circumferential face parts, in common. According to a constitution like this, since the central axes of the first via hole part and the second via hole parts can be unified, the forming accuracy of each via hole part is heightened, and coaxial structures with high accuracy may be obtained.

In order to attain the above objects, the producing method of a wiring base board of the present invention may also be constituted so that the producing method further includes a process that forms a first conductor part in the above-mentioned first via hole part, and a process that forms second conductor parts in the above-mentioned second via hole parts.

Furthermore, in the present invention, a wiring board unit or an electronic device constituted by providing the above-mentioned wiring base board is included, or an electric device constituted by using the above-mentioned wiring base board for a back panel unit is included.

The present invention provides a wiring base board to which the improvement of multiplexing and multilayer structure of the via hole parts is given. By this, it is possible to perform various high-speed transmission of differential transmission and so on, and, for example, the reliability of signal transmission is heightened, and the stability against an external noise can be strengthened. Because of this, the present invention is useful.

According to the wiring base board of the present invention, the plurality of the second via hole parts are provided inside the first via hole part, the coaxial structure parts are obtained between the first via hole part and the second via hole parts, and, along with this, the differential wiring structure can be realized between the plurality of the second via hole parts. By this, matching with wiring of a surface of the wiring base board is obtained, and the wiring base board in which the stability against an external noise is heightened can be realized.

In addition, according to the producing method of a wiring base board of the present invention, since the first via hole part and the second via hole parts are formed by using a common reference axis as a center, it is possible to form the first and the second via hole parts having high dimensional accuracy. Further, the coaxial structure parts with high accuracy are obtained, and the accuracy between the second via hole parts is also heightened. Because of this, it is possible to realize the differential wiring structure and the coaxial structures.

BRIEF DESCRIPTION OF THE DRAWINGS

The foregoing and other objects, features and attendant advantages of the present invention will be appreciated as the same become better understood by means of the following description and accompanying drawings wherein:

FIG. 15 is sectional views showing a producing method of a wiring base board according to the third embodiment of the present invention;

DETAILED DESCRIPTION OF THE PREFERRED EMBODIMENTS

First Embodiment

Figure 1:
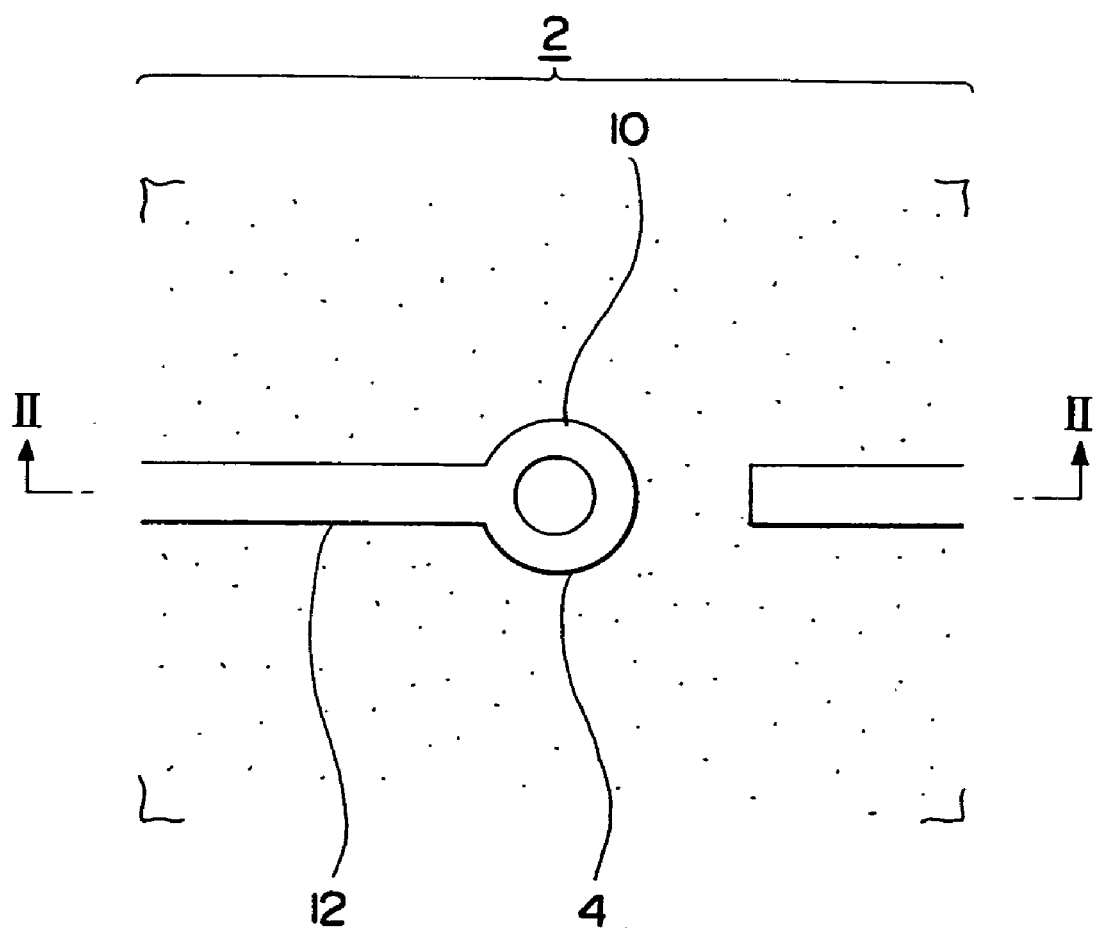
FIG. 1 is a plan view showing a part of a wiring base board.
Figure 2:
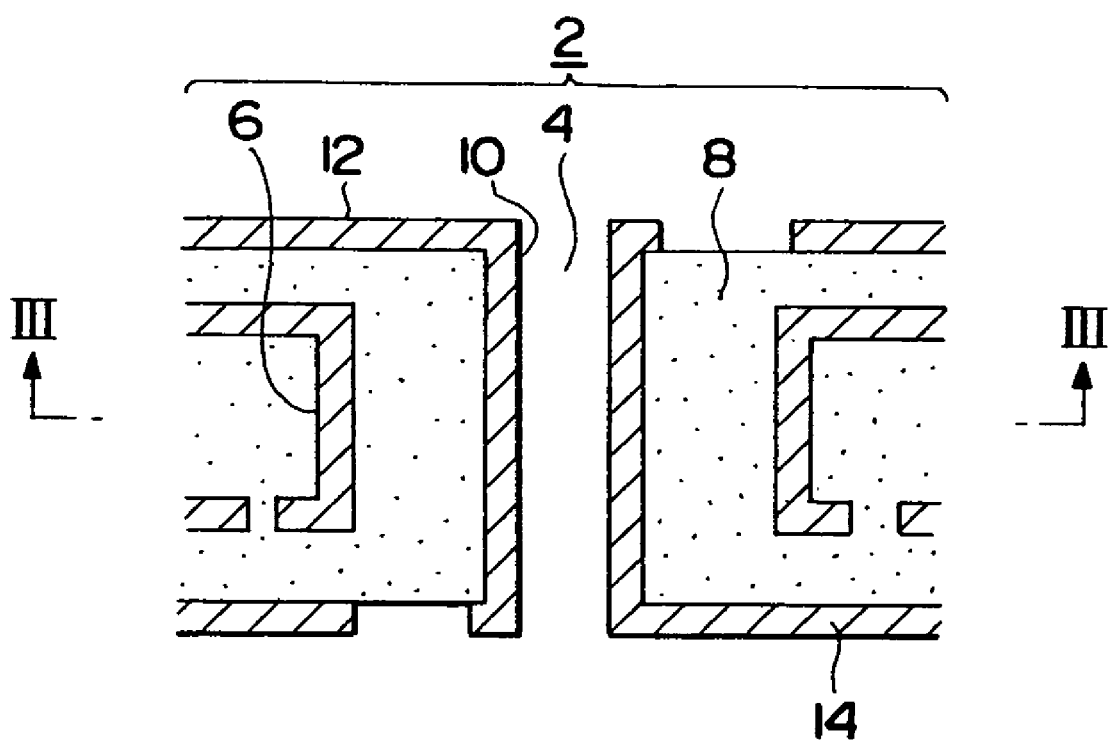
FIG. 2 is a sectional view taken along line II-II of FIG. 1.
Figure 3:
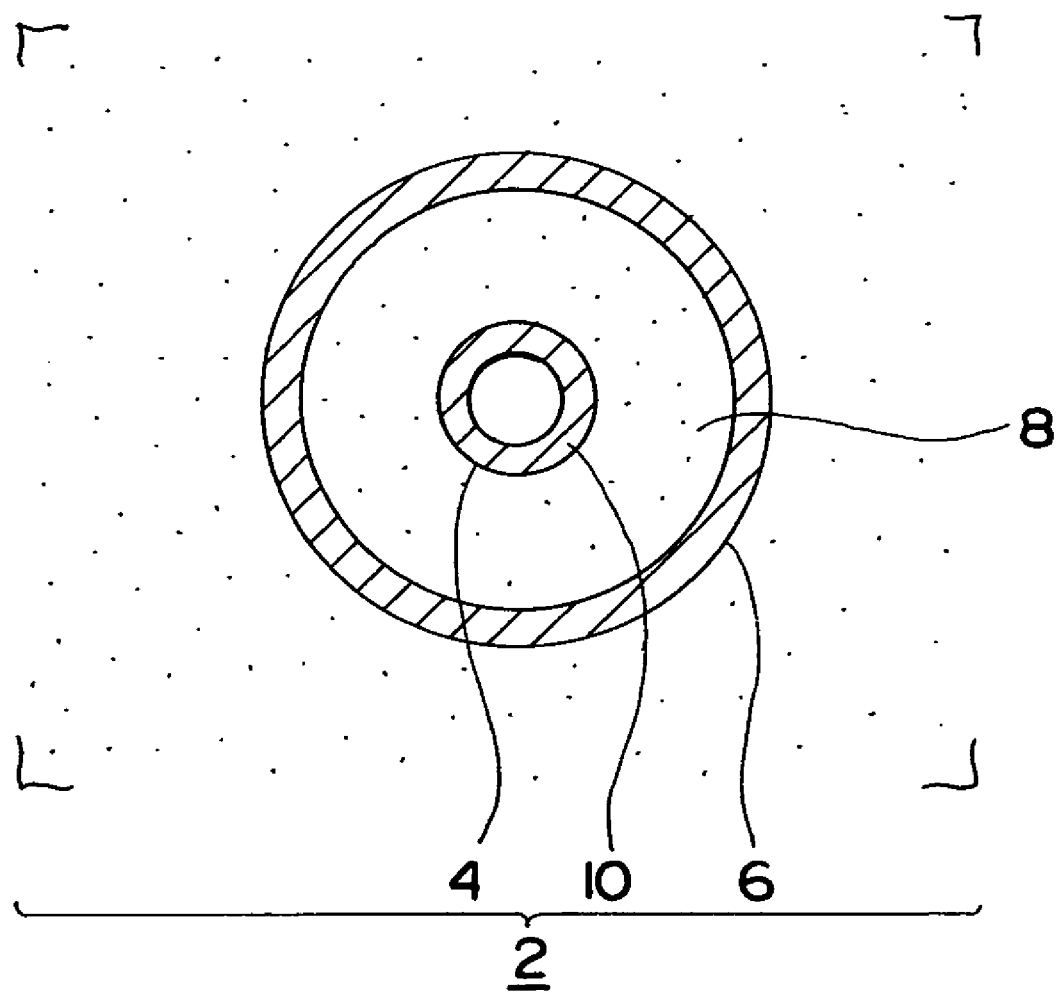
FIG. 3 is a sectional view taken along line III-III of FIG. 2.
Figure 4:
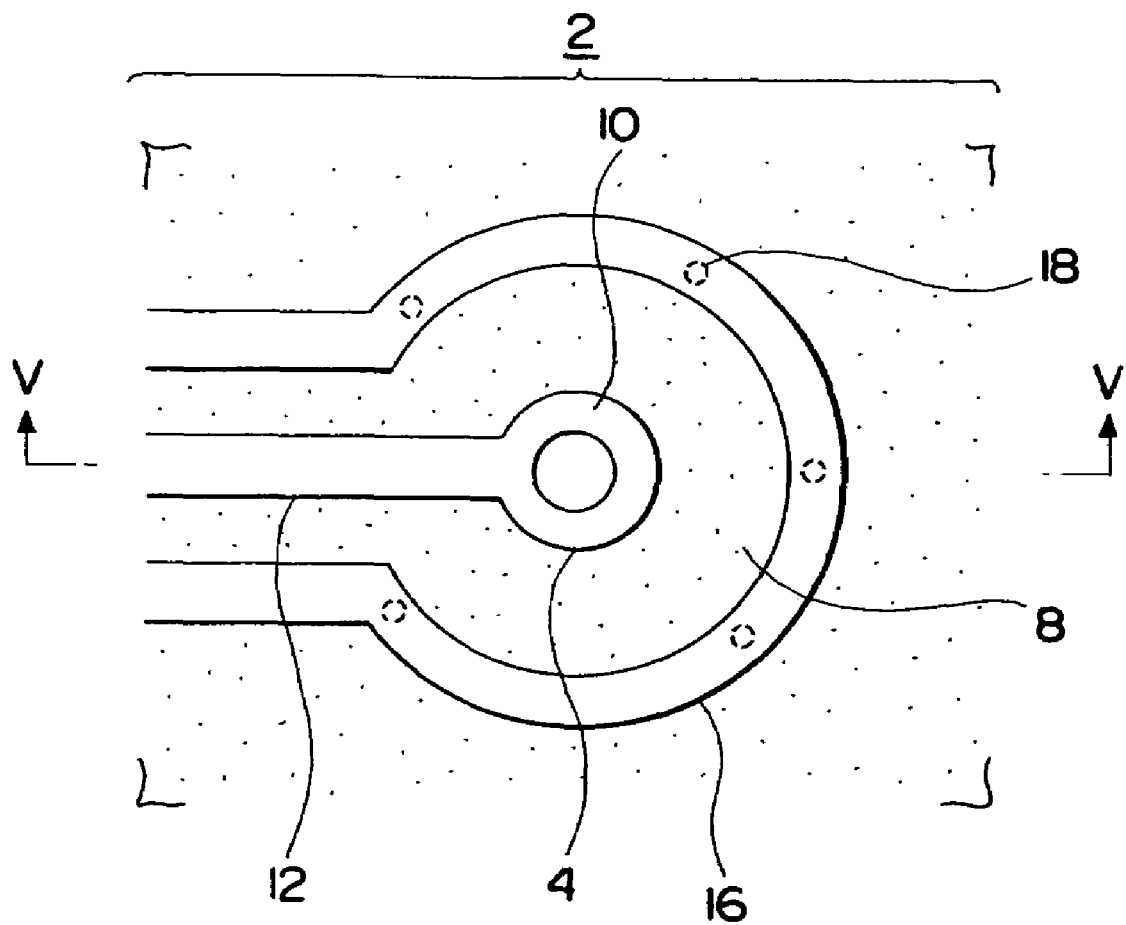
FIG. 4 is a plan view showing a part of another wiring base board.
Figure 5:
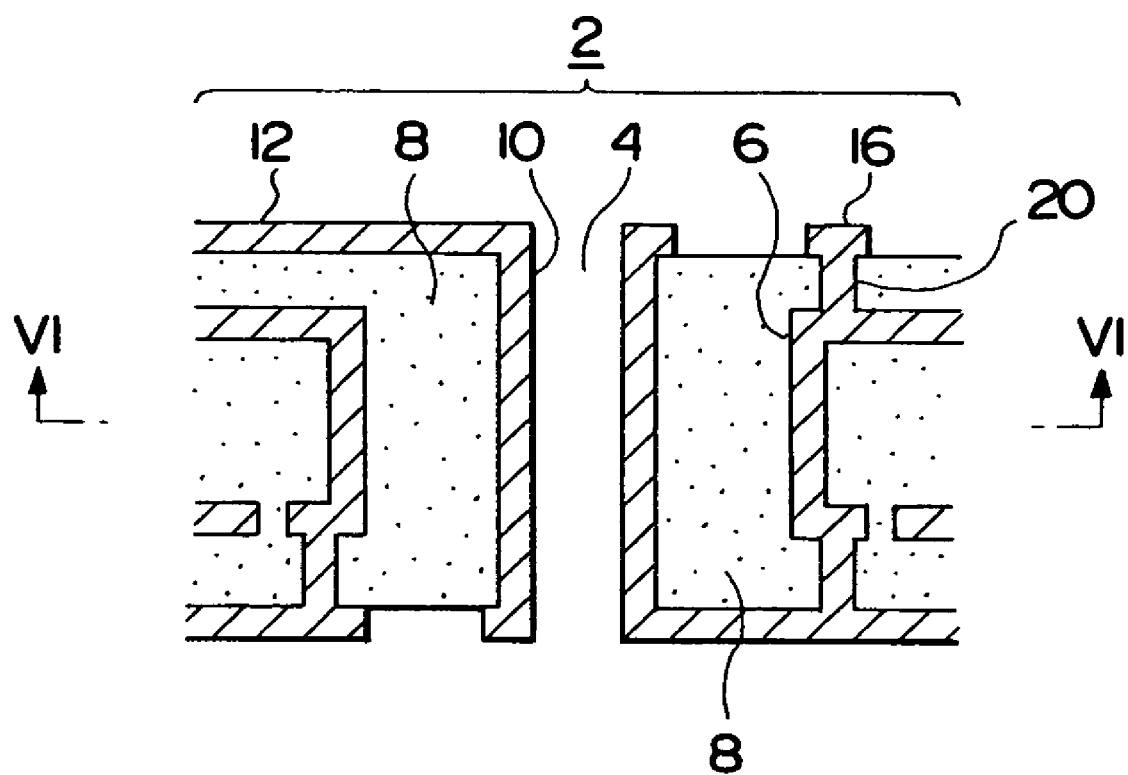
FIG. 5 is a sectional view taken along line V-V of FIG. 4.
Figure 6:
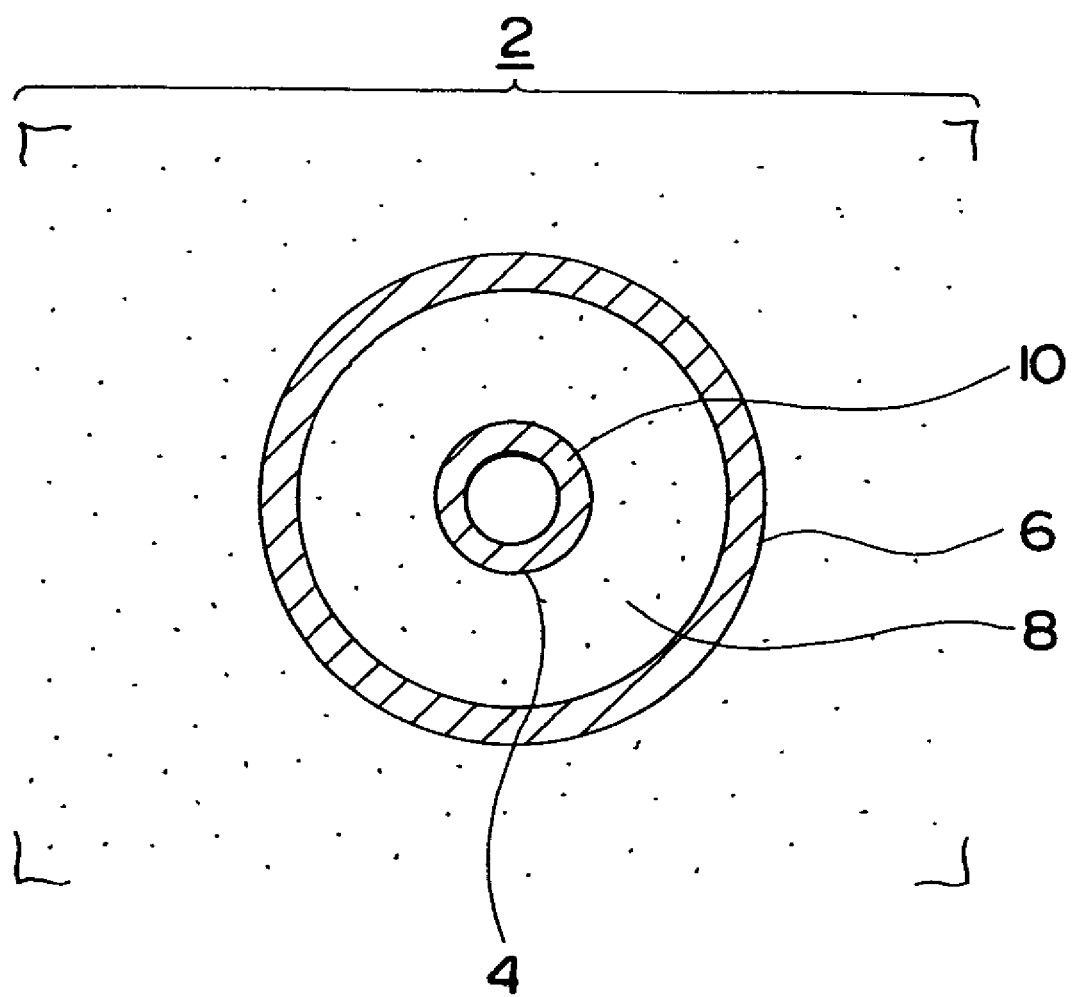
FIG. 6 is a sectional view taken along line VI-VI of FIG. 5.
Figure 7:
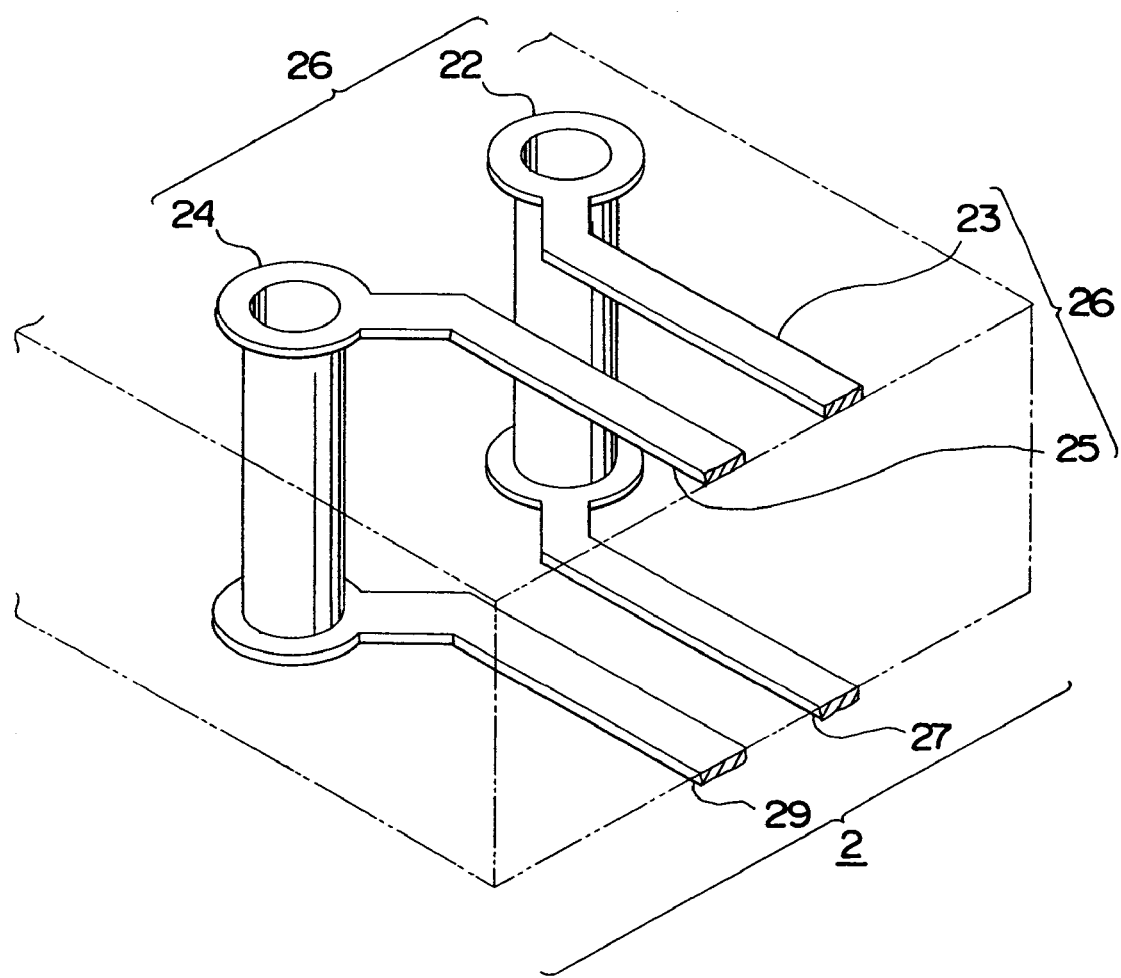
FIG. 7 is a drawing showing differential wiring of a wiring base board.
Figure 8:
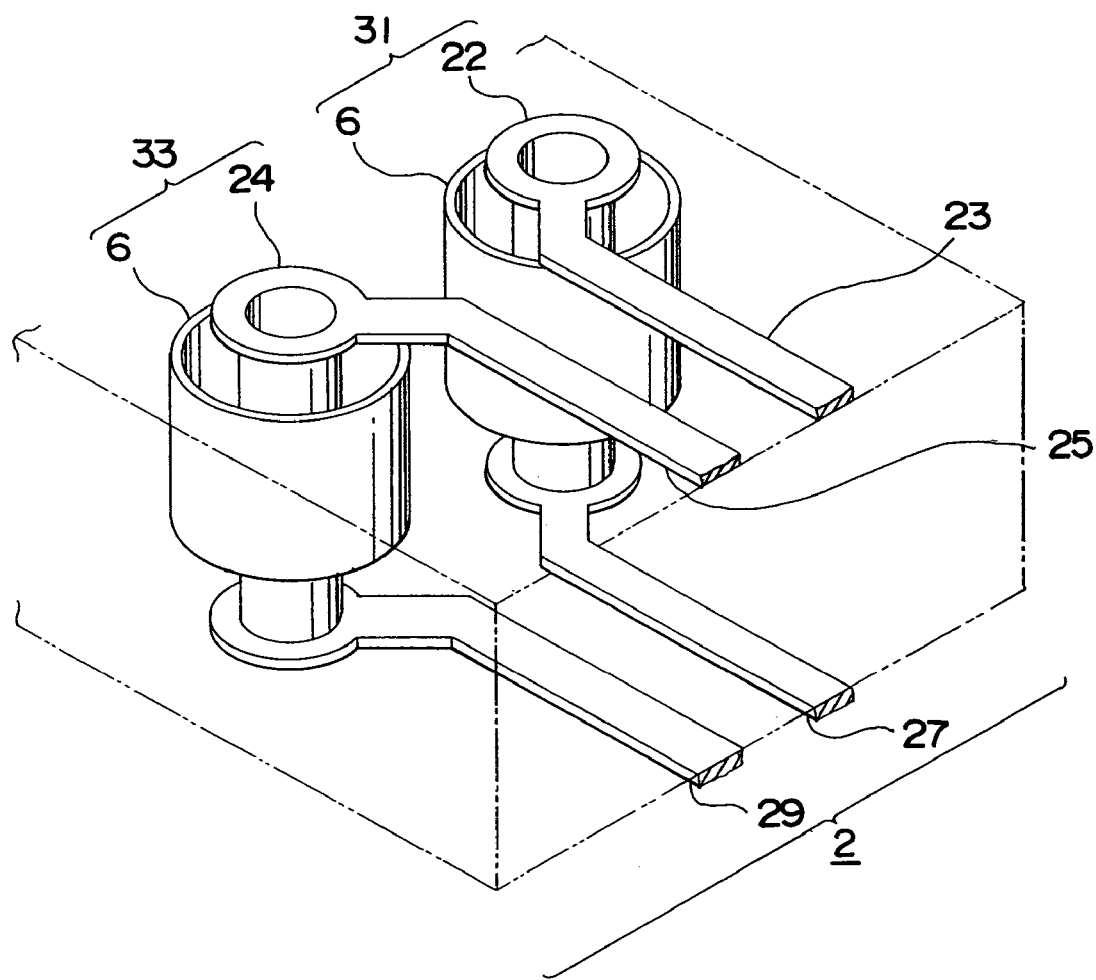
FIG. 8 is a drawing showing differential wiring of a wiring base board.
Figure 9:
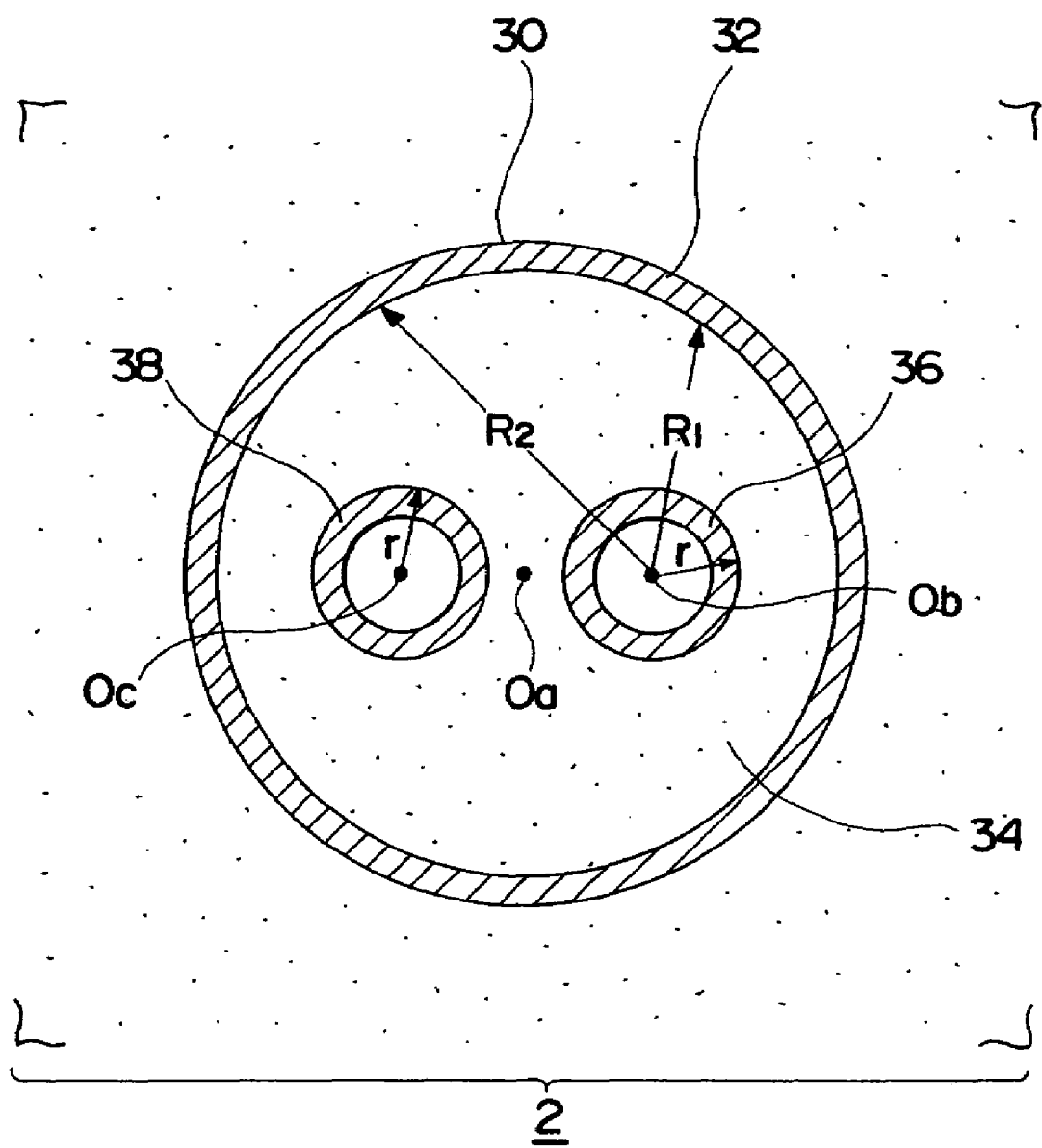
FIG. 9 is a sectional view showing a wiring structure of a wiring base board.
Figure 10:
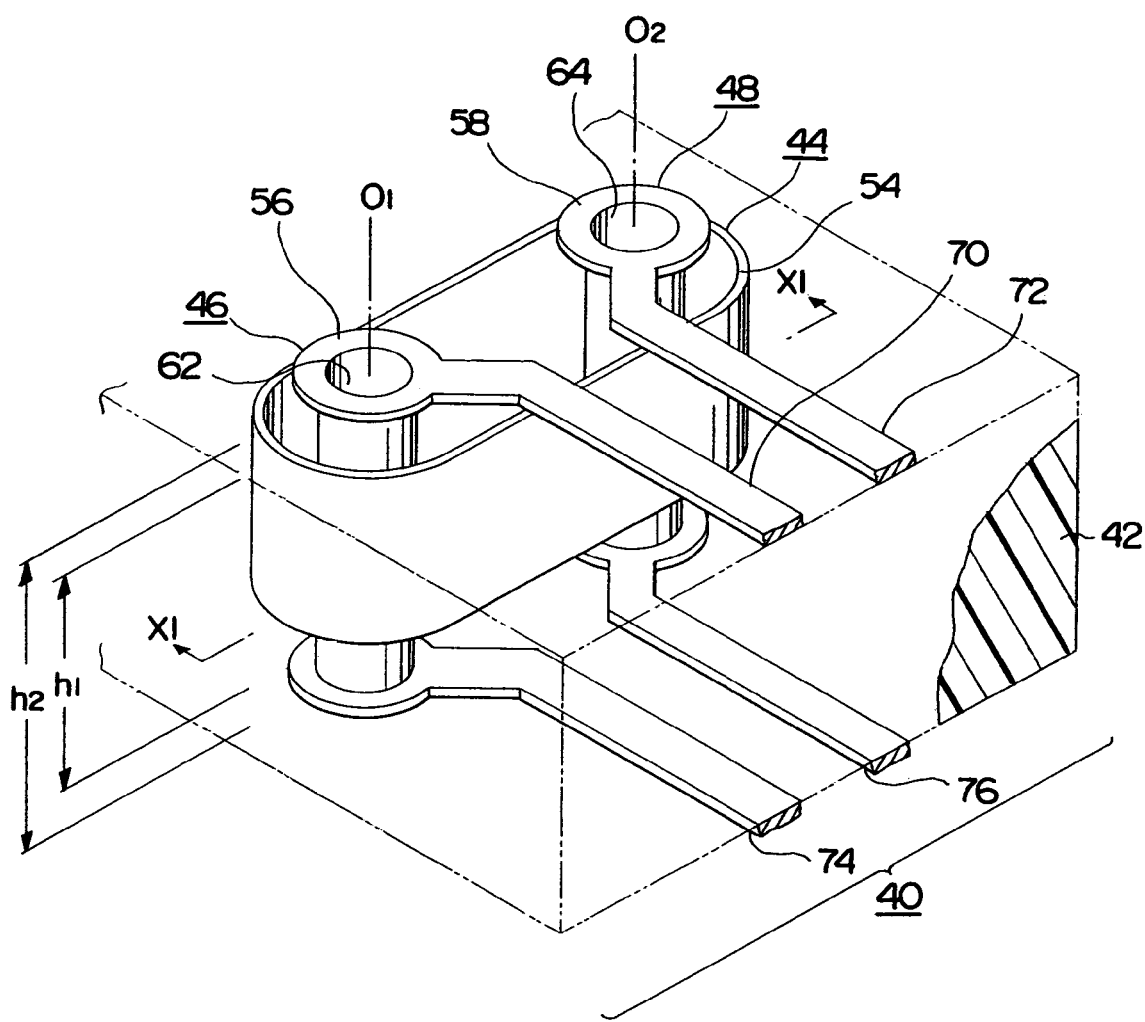
FIG. 10 is a perspective view showing a differential wiring structure of a wiring base board according to the first embodiment of the present invention.
Figure 11:
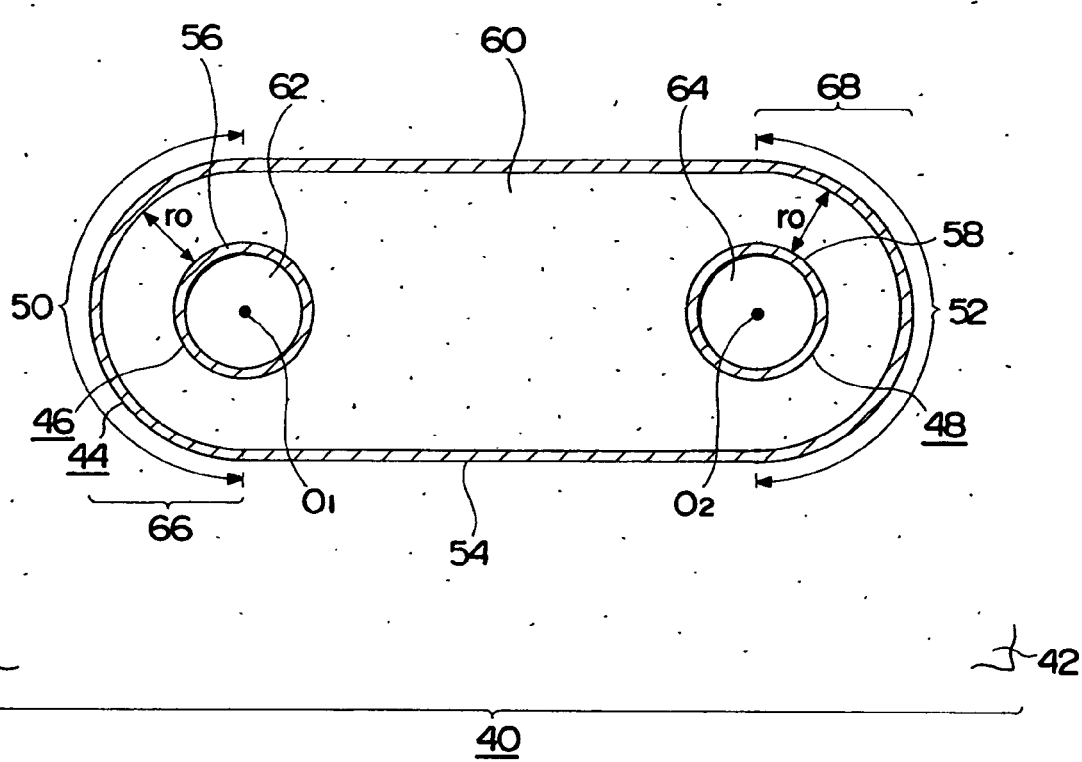
FIG. 11 is a sectional view taken along line XI-XI of FIG. 10.

The first embodiment of the present invention is explained by referring to FIG. 10 and FIG. 11. FIG. 10 is a perspective view showing a differential wiring structure of a wiring base board according to the first embodiment, and FIG. 11 is a sectional view taken along line XI-XI of FIG. 10.

This embodiment constitutes a wiring base board, which can perform various transmission such as differential transmission of plural signals, by means of multiplexing or double structure of a via hole part. This wiring base board makes it possible to electromagnetically couple between parallel conductors, and, for example, constitutes a double via structure of two cores by giving a structure in which those circumferences are surrounded with a conductor wall.

For this wiring base board 40, a substrate 42 is used as a core substrate formed by an insulating material. In this substrate 42, the first via hole part 44 is formed, and a plurality of the second via hole parts 46 and 48 are also formed by penetrating the via hole part 44. A plurality of circumferential face parts 50 and 52 are formed in the via hole part 44. A reference letter O1 is a central axis of the circumferential face part 50, and a reference letter O2 is a central axis of the circumferential face part 52. The via hole part 46 constitutes concentric circles by making the central axis O1 a center, and the via hole part 48 constitutes concentric circles by making the central axis O2 a center. The first conductor part 54 is formed in the via hole part 44. The second conductor part 56 is formed in the via hole part 46, and the second conductor part 58 is formed in the via hole part 48, respectively. A height h2 of the conductor parts 56 and 58 is set to a value higher than a height h1 of the conductor part 54. Further, an insulator is filled into a part which is surrounded with the conductor part 54, and an insulating layer 60 is formed. The insulating layer 60 may also be formed with either of an organic material and an inorganic material. In this embodiment, through hole parts 62 and 64 which are surrounded with the conductor parts 56 and 58 are an air core. For each of the conductor parts 54, 56 and 58, a conductive material such as a conductive metal and a conductive paste is used. Each of the conductive parts 54, 56 and 58 is formed by a process such as spreading, plating or evaporation of the conductive material.

Therefore, since the via hole parts 46 and 48 are formed in the via hole part 44, the via of a double structure is constituted, and the conductor parts 56 and 58 which are surrounded with the conductor part 54 like an elliptic cylinder are also constituted as parallel conductors. That is, the via hole parts 46 and 48 are a plural-cored structure. Further, at the circumferential face part 50, the first coaxial structure part 66 is constituted by the opposing conductor part 54 and conductor part 56, and, at the circumferential face part 52, a second coaxial structure part 68 is constituted by the opposing conductor part 54 and conductor part 58. In these coaxial structure parts 66 and 68, a distance ro between an outer circumferential face part of the conductor part 58 and an inner circumferential face part of the conductor part 54 is equal distances, and the opposing circular faces with the same center are formed. Furthermore, to the conductor parts 56 and 58, wiring patterns 70 and 72 are connected to an upper face side of the substrate 42, and wiring patterns 74 and 76 are connected to its lower face side.

According to a constitution like this, each of the adjoining wiring patterns 70 and 72 and each of the adjoining wiring patterns 74 and 76 are used as differential wiring, respectively. Similarly, the conductor parts 56 and 58 forming the parallel conductors are electromagnetically coupled through the insulating layer 60 and are constituted as the differential wiring. As a result, it is possible to make the conductor parts 56 and 58 match with each of the adjoining wiring patterns 70 and 72 or each of the adjoining wiring patterns 74 and 76. Because of this, the differential transmission of a high-speed signal can be also performed in a direction of thickness of the substrate 42, and a contribution to the improvement of high-speed transmission may be given.

Furthermore, if the conductor part 54 is made into a grounded conductor by grounding the conductor part 54, stability against a noise in a transmission signal of the conductor parts 56 and 58 having the coaxial structure parts 66 and 68 is further heightened in addition to the stability of differential transmission against a noise. In the coaxial structure parts 66 and 68, the distance ro between the outer circumferential face part of the conductor part 58 and the inner circumferential face part of the conductor part 54 is equal distances, and the opposing circular faces having the same center are formed. Moreover, the distance ro between the outer circumferential face part of the conductor part 58 and the inner circumferential face part of the conductor part 54 is the shortest distance. Because of this, various kinds of electrical characteristics such as inductance, electrostatic capacity and characteristic impedance between the conductor part 54 and the conductor part 56 or 58 are to be controlled by the coaxial structure parts 66 and 68.

Second Embodiment

Figure 12:
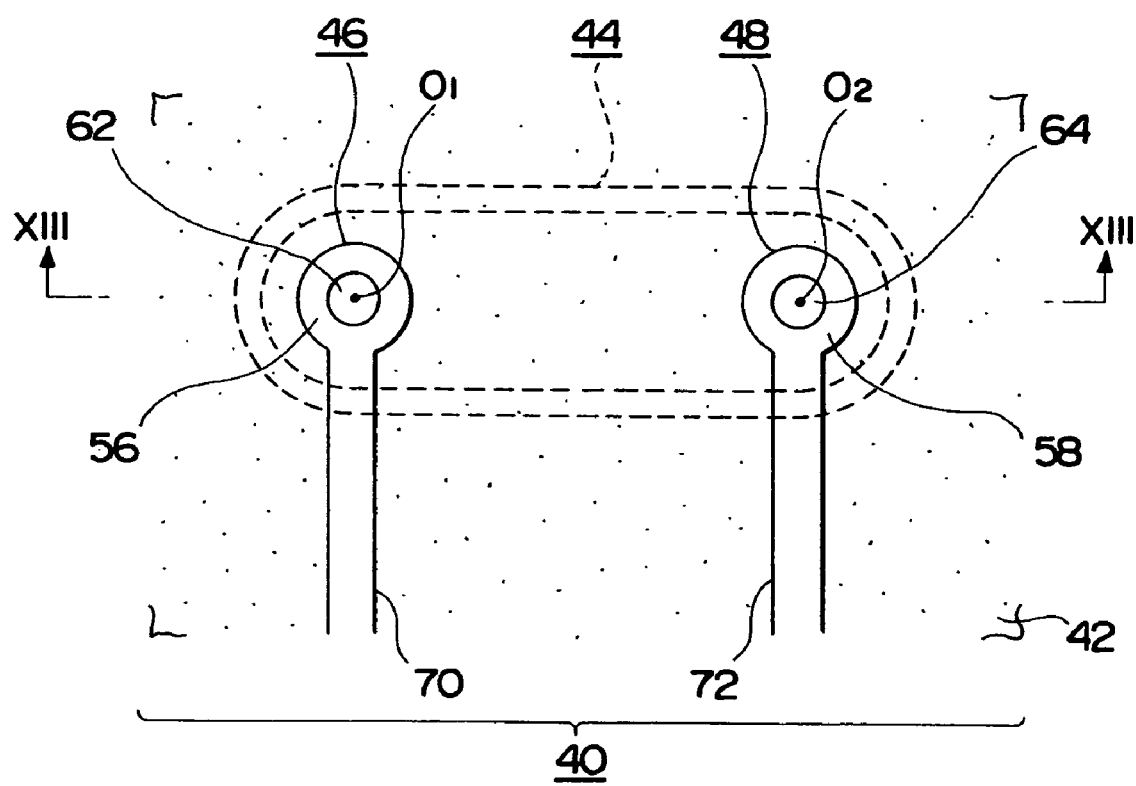
FIG. 12 is a plan view showing a part of a wiring base board according to the second embodiment of the present invention.
Figure 13:
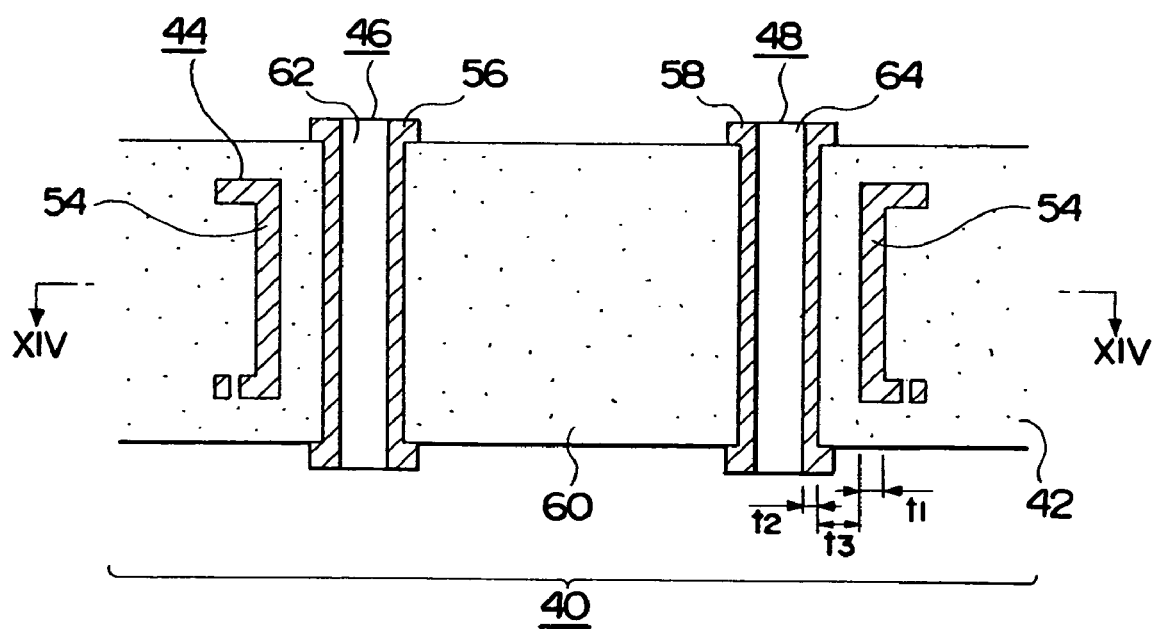
FIG. 13 is a sectional view taken along line XIII-XIII of FIG. 12.
Figure 14:
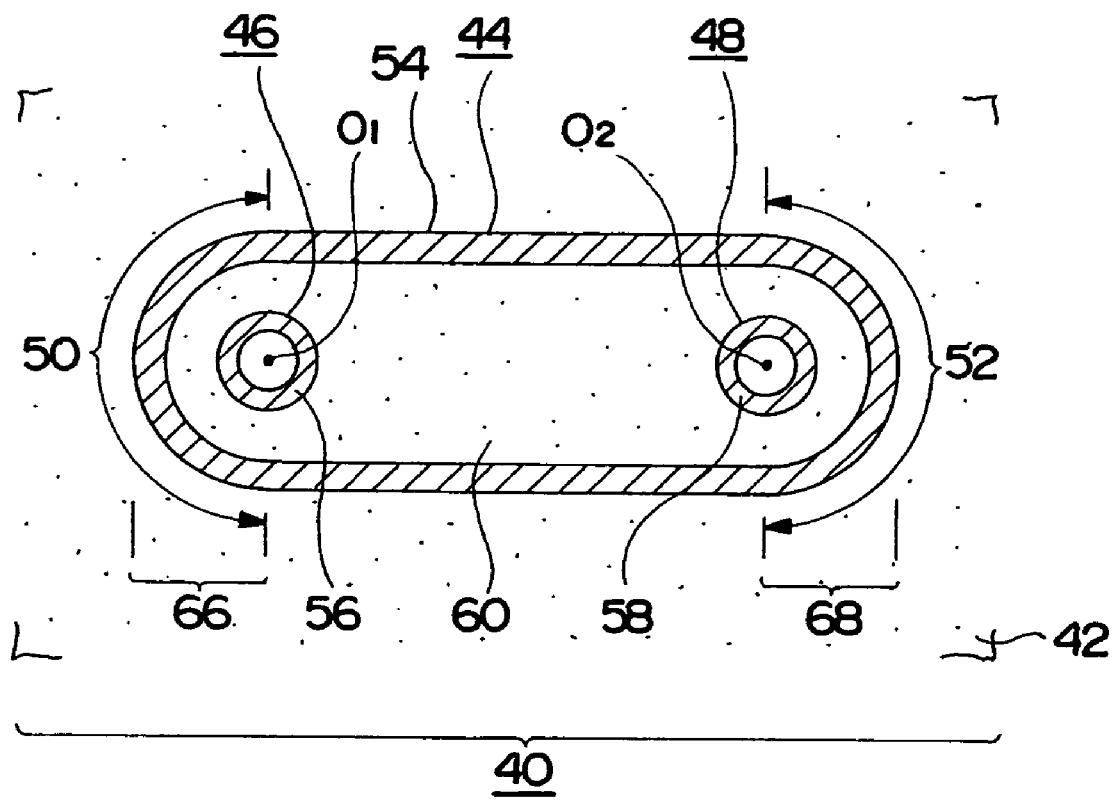
FIG. 14 is a sectional view taken along line XIV-XIV of FIG. 13.

The second embodiment of the present invention is explained by referring to FIG. 12 through FIG. 14. FIG. 12 is a plan view showing a part of a surface of a wiring base board according to the second embodiment, FIG. 13 is a sectional view taken along line XIII-XIII of FIG. 12, and FIG. 14 is a sectional view taken along line XIV-XIV of FIG. 13. In each of the drawings, the same portions as those of the first embodiment are indicated by the same reference numerals.

A wiring base board 40 of this embodiment shows a specific example of the first embodiment. For example, a conductor wall like an elliptic cylinder is arranged inside the wiring base board 40, and parallel conductors of plural cores are provided at an inside of the conductor wall. By a structure like this, electromagnetic coupling between the parallel conductors is given, and a plural-cored coaxial structure is also constituted.

As shown in FIG. 12, in this wiring base board 40, the first via hole part 44 is formed inside a substrate 42 which is formed by an insulating material, and the second via hole parts 46 and 48 are formed at the inside of that via hole part 44. Further, wiring patterns 70 and 72 are formed on an upper face of the substrate 42. The wiring pattern 70 is connected to a conductor part 56, and the wiring pattern 72 is connected to a conductor part 58. Through hole parts 62 and 64 inside the conductor parts 56 and 58 are an air core.

Further, a conductor part 54 is constituted as a grounded conductor, and is formed as a grounded (GND) wall of the conductor parts 56 and 58 which constitute the parallel conductors. Furthermore, inside of the conductor part 54 formed at an inner wall part of the via hole part 44, an insulating layer 60 is formed by an insulator. Similarly to the first embodiment, the insulating layer 60 may also be formed with either of an organic material and an inorganic material. Since a thickness t1 of the conductor part 54 is uniform and a thickness t2 of the conductor parts 56 and 58 is also uniform, a thickness t3 of the insulating layer 60 inside the coaxial structure parts 66 and 68 is also set equally.

According to the wiring base board 40 of a constitution like this, similarly to the first embodiment, differential wiring is constituted at each of the via hole parts 46 and 48, and the differential transmission of a high-speed signal can be performed in a direction of thickness of the substrate 42. Because of this, a contribution to the improvement of high-speed transmission comes to be given. Further, since each of the conductor parts 56 and 58 is surrounded with the conductor part 54 constituting the grounded conductor, the stability against a noise in a transmission signal of the conductor parts 56 and 58 comes to be further heightened in addition to the stability of differential transmission against a noise. Furthermore, the control of electrical characteristics in relation to the coaxial structure parts 66 and 68 is as described in the first embodiment.

Third Embodiment

The third embodiment of the present invention is explained by referring to FIG. 15 and FIG. 16. FIG. 15 is sectional views showing an example of a producing method of a wiring base board according to the third embodiment, and FIG. 16 is plan views showing a drilling process.

This embodiment provides a forming method of a wiring base board 40 which has the first and the second via hole parts 44, 46 and 48 forming coaxial structures of plural cores, and so on.

For production of this wiring base board 40, a substrate 43 formed by an insulating material is used. As shown in FIG. 15A, on a surface and a back face of this substrate 43, wiring patterns 80 and 82 composed of a conductor layer are formed. A reference axis Or is set through positioning of the substrate 43, and, along with this, central axes O1 and O2 to form the via hole parts 44, 46 and 48 are set. Each of the central axes O1 and O2 is set by using the reference axis Or as a standard, and becomes a center of each of circumferential face parts 50 and 52 of the via hole part 44 forming an elliptic shape. In this case, for example, it may also be performed so that the central axis O1 is set as a reference axis instead of the reference axis Or and the central axis O2 is set.

Figure 16A:
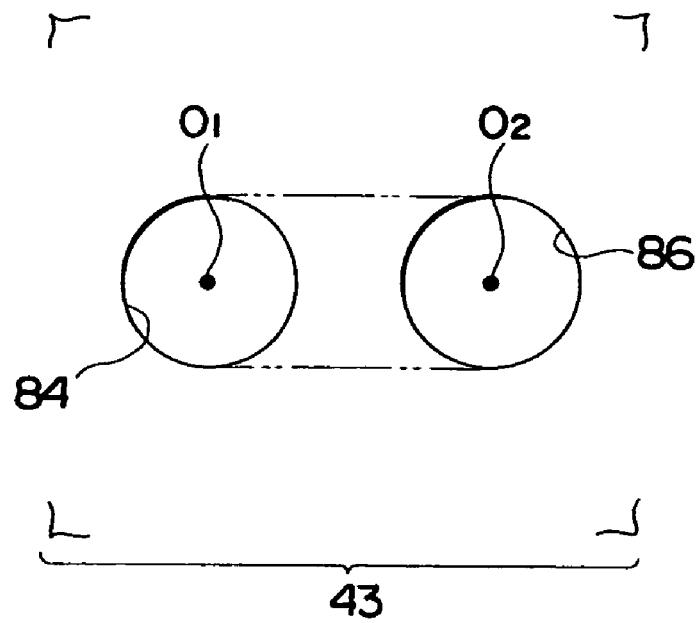
FIG. 16 is drawings showing a drilling process in the producing method of a wiring base board.

As shown in FIG. 15B and FIG. 16A, in the substrate 43, two through hole parts 84 and 86 forming a real circle are formed by making the central axes O1 and O2 centers. Outside circumferential face parts of these through hole parts 84 and 86 come to constitute the circumferential face parts 50 and 52 described before.

Figure 16B:
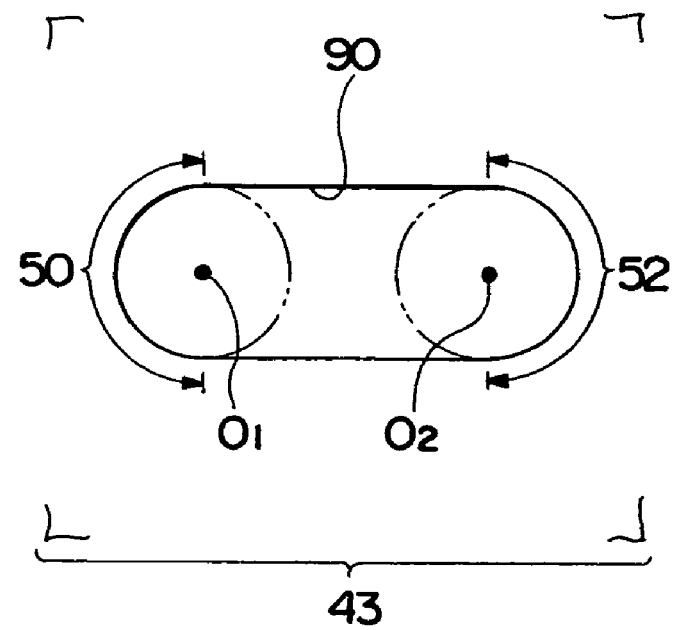

As shown in FIG. 15C and FIG. 16B, a substrate part 88 between tangential parts which bridge between the two through hole parts 84 and 86 is cut off, and the two through hole parts 84 and 86 are communicated. By this, an elliptic-shaped through hole part 90 which has parts of the through hole parts 84 and 86 as the circumferential face parts 50 and 52 is formed, and the first via hole part 44 is formed by this elliptic-shaped through hole part 90.

As shown in FIG. 15D, in this via hole part 44, a conductor part 54 is formed by using the plating of a metal, the spreading of a conductive paste, or a conductive material. An insulator composed of an organic material or an inorganic material is filled into a space part which is surrounded with the conductor part 54, and an insulating layer 60 is formed. On a surface side and a back face side of the substrate 43, substrates 92 and 94 composed of an insulating material which covers uniformly the insulating layer 60 are laminated, and a substrate 42 which is a multilayer substrate is constituted. In this embodiment, the insulating layer 60 and the substrates 92 and 94 are constituted by different members. However, it may also be constituted so that a resin including in the substrates 92 and 94 is poured into the elliptic-shaped through hole part 90 at the time of a press process, and so that the insulating layer 60 is constituted by that resin.

Even if a multilayer substrate is constituted like this, the central axes O1 and O2 set in advance have coincided. As shown in FIG. 15E, by making each of the central axes O1 and O2 a center, holes are drilled in the insulating layer 60 and the substrates 92 and 94, and through hole parts 98 and 100 of a real circle are formed. By each of the through hole parts 98 and 100, the second via hole parts 46 and 48 are formed. Assuming that a radius of the through hole parts 84 and 86 of the via hole part 44 side is r1 and a radius of the through hole parts 98 and 100 of the via hole parts 46 and 48 side is r2, a relation of large and small between the radiuses r1 and r2 is r1>r2, and the central axes O1 and O2 are common. Because of this, the through hole part 84 and the through hole part 98 constitute the holes of concentric circles, and the through hole part 86 and the through hole part 100 also constitute the holes of concentric circles. In addition, if a thickness t4 of the conductor part 54 is uniform, and if each of the through hole parts 98 and 100 is the same diameter with the radius r2, a thickness of the insulating layer 60 becomes an identical thickness t5.

Further, as shown in FIG. 15F, at an inner wall face and an opened edge part of each of the through hole parts 98 and 100, the second conductor parts 56 and 58 are formed with a uniform thickness by the plating of a metal or the spreading of a conductive paste, or by using a conductive material. In this case, although an air-core state is given to an inside of the conductor parts 56 and 58 by having the through hole parts 62 and 64, it may also be constituted so that a conductive material such as a conductive paste or a non-conductive material such as a non-conductive resin is filled into the through hole parts 62 and 64, and so that a constitution of a non-air core is given. Making into a non-air core like this may be useful for the prevention of an entrance of a foreign substance.

According to such a producing method, the via hole parts 46 and 48 are formed by using the central axes O1 and O2, which are set to form the circumferential face parts 50 and 52 (FIG. 11 and FIG. 14) of the via hole part 44, as a center. Because of this, for example, if the central axes O1 and O2 are set by making the reference axis Or a standard, the through hole parts 84, 86 and 90 and the through hole parts 98 and 100 of the via hole parts 44, 46 and 48 are formed with high dimensional accuracy by means of a spot-facing process. If the thickness of a film of the conductor part 54 is made uniformly and the thickness of a film of each of the conductor parts 56 and 58 is also made uniformly, a space between the conductor part 54 and the conductor part 56 and a space between the conductor part 54 and the conductor part 58 become uniform, and a thickness t5 of the insulating layer 60 within these spaces becomes identical. As a result, the coaxial structure parts 66 and 68 with high dimensional accuracy can be obtained, and it is possible to realize the coaxial structure parts 66 and 68 of a constitution like this with ease. In other words, it is possible to prevent a decline of processing accuracy due to a gap of dimensional accuracy in case of setting the via hole part 44 and the via hole parts 46 and 48 by using different central axes.

Fourth Embodiment

Figure 17:
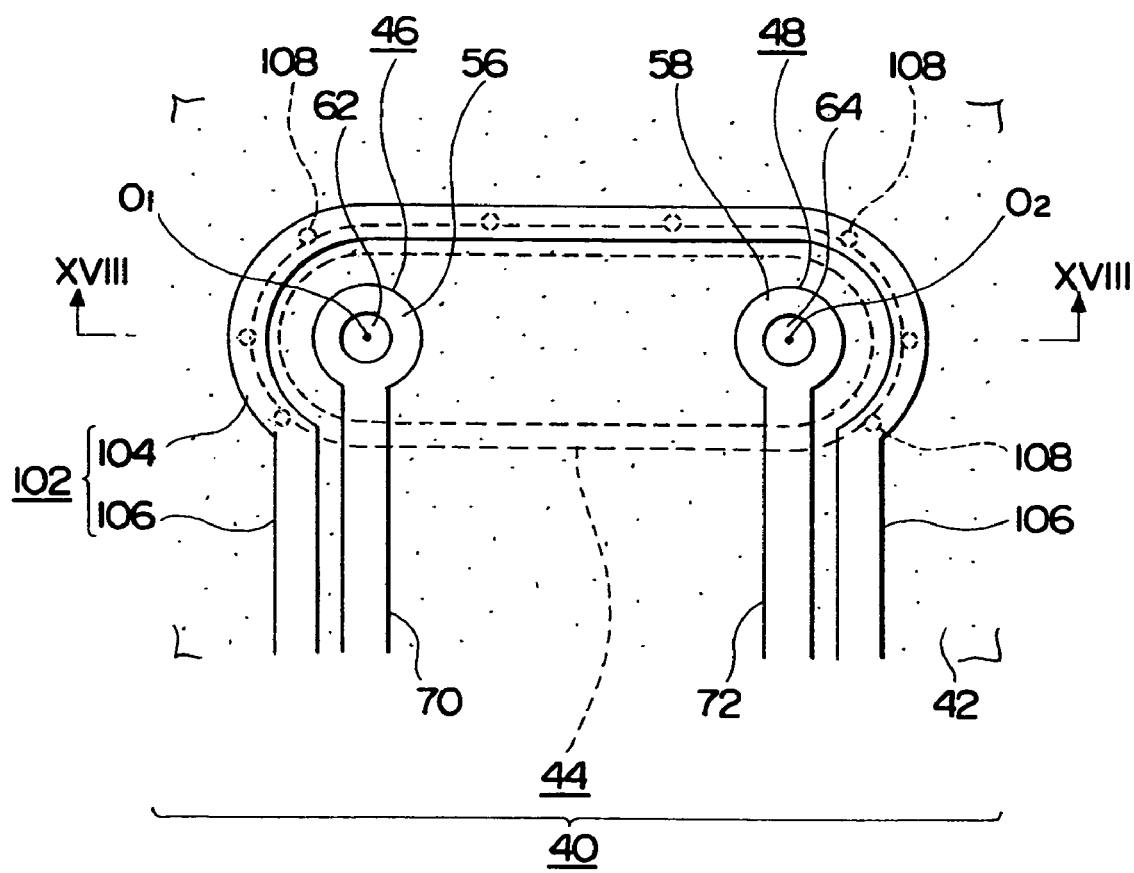
FIG. 17 is a plan view showing a part of a wiring base board according to the fourth embodiment of the present invention.
Figure 18:
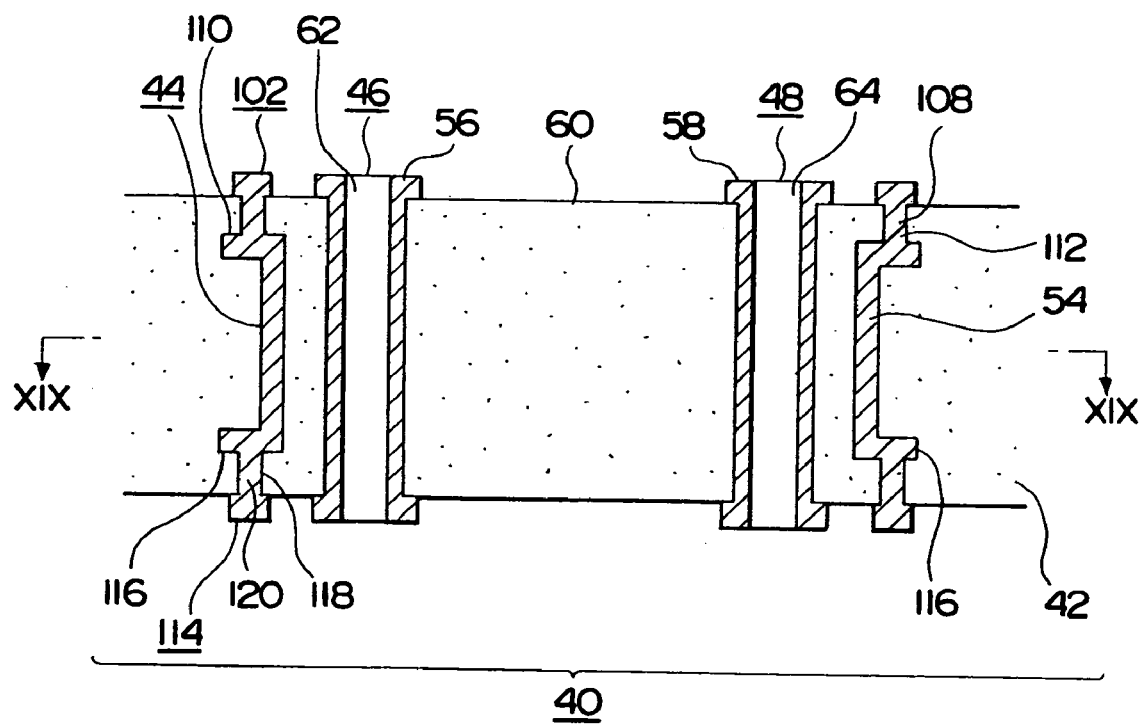
FIG. 18 is a sectional view taken along line XVIII-XVIII of FIG. 17.
Figure 19:
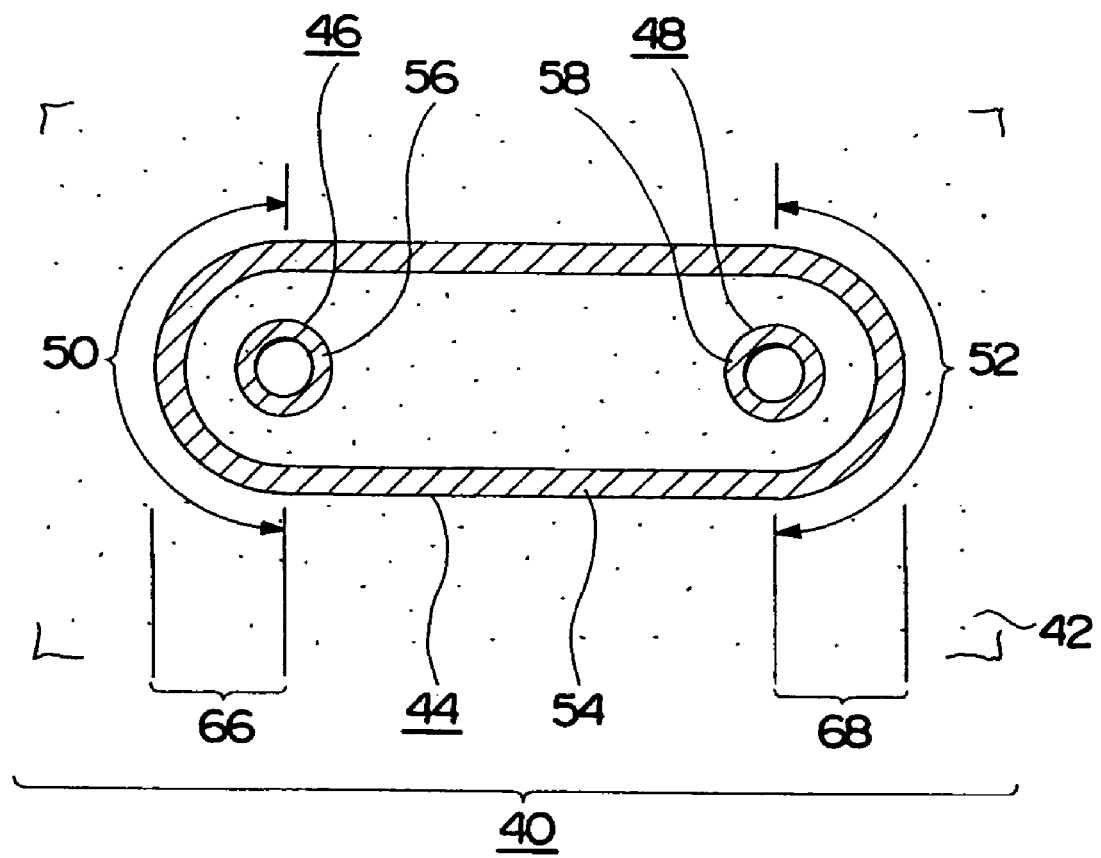
FIG. 19 is a sectional view taken along line XIX-XIX of FIG. 18.

The fourth embodiment of the present invention is explained by referring to FIG. 17 through FIG. 19. FIG. 17 is a plan view showing a part of a surface of a wiring base board according to the fourth embodiment, FIG. 18 is a sectional view taken along line XVIII-XVIII of FIG. 17, and FIG. 19 is a sectional view taken along line XIX-XIX of FIG. 18. In each drawing, the same portions as those of the first through third embodiments are indicated by the same reference numerals.

This embodiment is a constitution in which via hole parts constituting parallel conductors of the wiring base board 40 and a guard pattern part surrounding wiring patterns are provided in a surface part of the wiring base board 40, and in which the guard pattern part is electrically connected to the via hole parts.

As shown in FIG. 17, in this wiring base board 40, the first via hole part 44 is formed inside the substrate 42 which is made of an insulating material, and the second via hole parts 46 and 48 are also formed at an inside of this via hole part 44. Further, wiring patterns 70 and 72 are formed on an upper face of the substrate 42. The wiring pattern 70 is connected to a conductor part 56, and the wiring pattern 72 is connected to a conductor part 58. Through hole parts 62 and 64 inside the conductor parts 56 and 58 are an air core.

Further, a guard pattern part 102 which surrounds the via hole parts 46 and 48 and the wiring patterns 70 and 72 on an upper face part of the substrate 42 is formed in a surface part of the wiring base board 40. The guard pattern part 102 has a similar-figure pattern part 104 corresponding to the via hole part 44 and parallel pattern parts 106 parallel with the wiring patterns 70 and 72. In the similar-figure pattern part 104 of the guard pattern part 102, a plurality of non-through holes 108 as a penetration part to connect with the conductor part 54 of the via hole part 44 are formed. The non-through holes 108 are made into non-penetration by placing a conductor inside a through hole.

Further, as described before, the conductor part 54 is made up as a grounded conductor, and is constituted as a grounded (GND) wall of the conductor parts 56 and 58 forming the parallel conductors. In the conductor part 54, a flange part 110 parallel with the guard pattern part 102 is formed through a part of the substrate 42. Each of the non-through holes 108 penetrates the substrate 42 which exists between the flange part 110 and the guard pattern part 102, and, in each of the non-through holes 108, a conductor 112 composed of a conductive paste and so on is provided. The guard pattern part 102 and the conductor part 54 of the via hole part 44 are electrically connected through the conductors 112. That is, the guard pattern part 102 and the via hole part 44 constitute a common GND wall or GND part.

Such a constitution is a similar constitution also in the back face side of the substrate 42, and a guard pattern part 114 has a similar-figure pattern part (104) and parallel pattern parts (106) similar to the guard pattern part 102 of the surface side. At a lower edge of the conductor part 54, a flange part 116 parallel with the guard pattern part 114 is formed through a part of the substrate 42. Each of non-through holes 118 penetrates the substrate 42 which exists between the flange part 116 and the guard pattern part 114, and, in each of the non-through holes 118, a conductor 120 composed of a conductive paste and so on is provided. The guard pattern part 114 and the conductor part 54 of the via hole part 44 are electrically connected through the conductors 120.

Furthermore, also in this embodiment, as shown in FIG. 19, the conductor parts 56 and 58 of the via hole parts 46 and 48 are provided at an inside of the conductor part 54 forming an elliptic ring shape of the via hole part 44.

According to a constitution like this, also in this wiring base board 40, similarly to the first or the second embodiment, differential wiring is constituted by each of the via hole parts 46 and 48, and the differential transmission of a high-speed signal can be performed in the direction of thickness of the substrate 42. Because of this, a contribution to the improvement of high-speed transmission comes to be given. Further, since each of the conductor parts 56 and 58 is surrounded with the conductor part 54 constituting the grounded conductor and is also surrounded with the guard pattern part 102, stability against a noise in a transmission signal of the conductor parts 56 and 58 comes to be further heightened in addition to the improvement of stability of differential transmission of the wiring patterns 70 and 72 against noise. Furthermore, the control of electrical characteristics in respect to the coaxial structure parts 66 and 68 is as described in the first embodiment.

Fifth Embodiment

Figure 20:
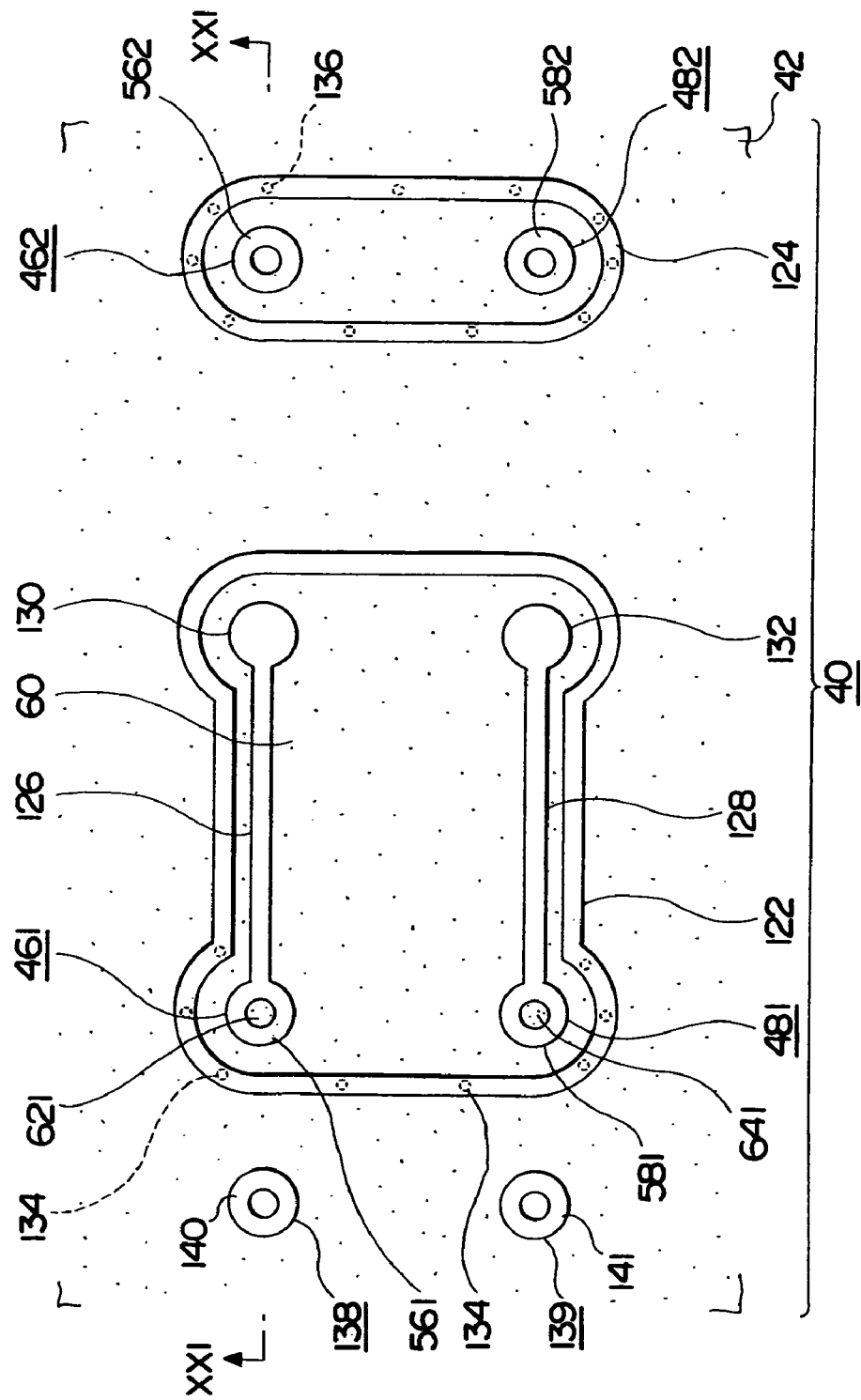
FIG. 20 is a plan view showing a part of a wiring base board according to the fifth embodiment of the present invention.
Figure 21:
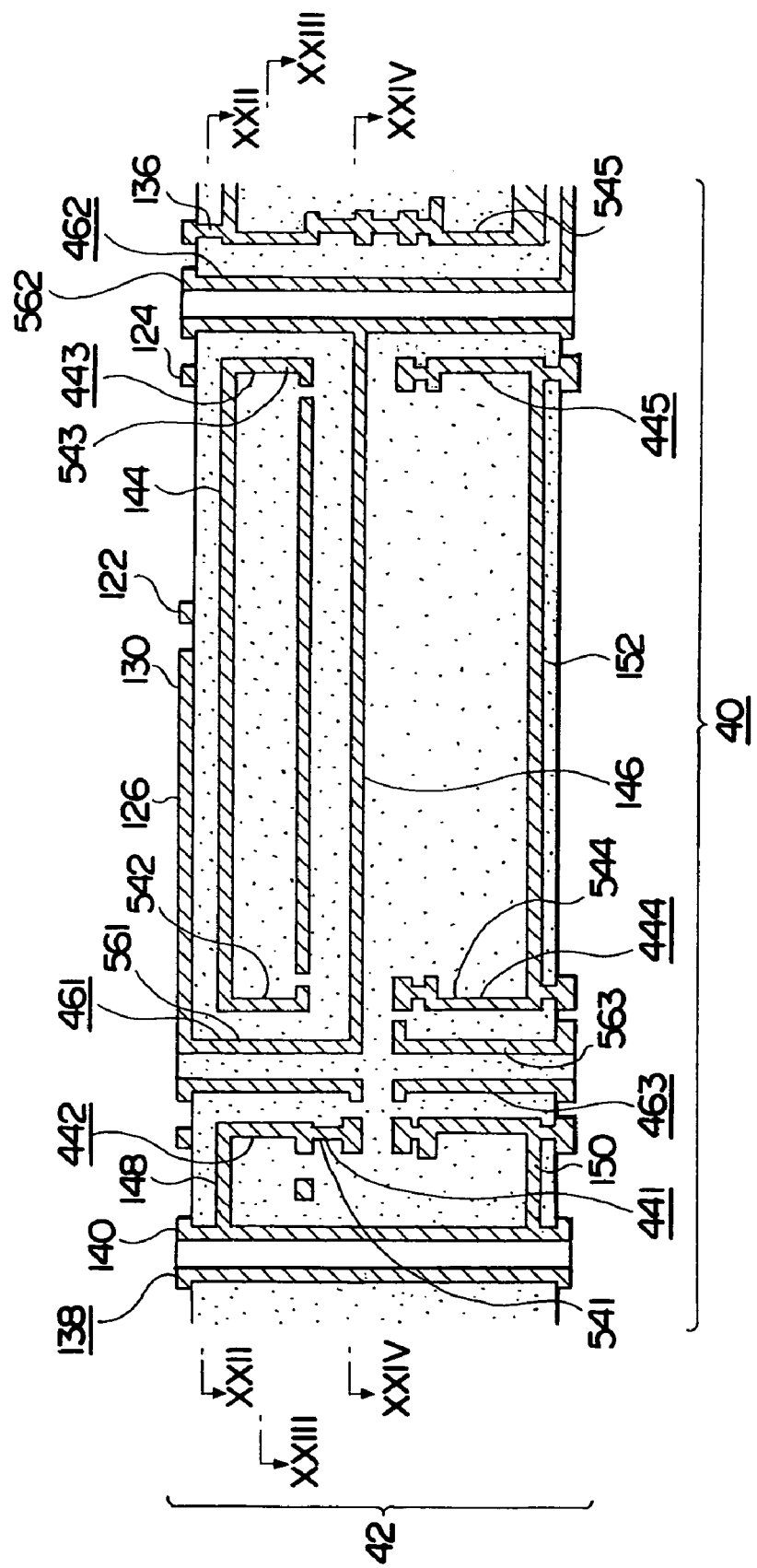
FIG. 21 is a sectional view taken along line XXI-XXI of FIG. 20.
Figure 22:
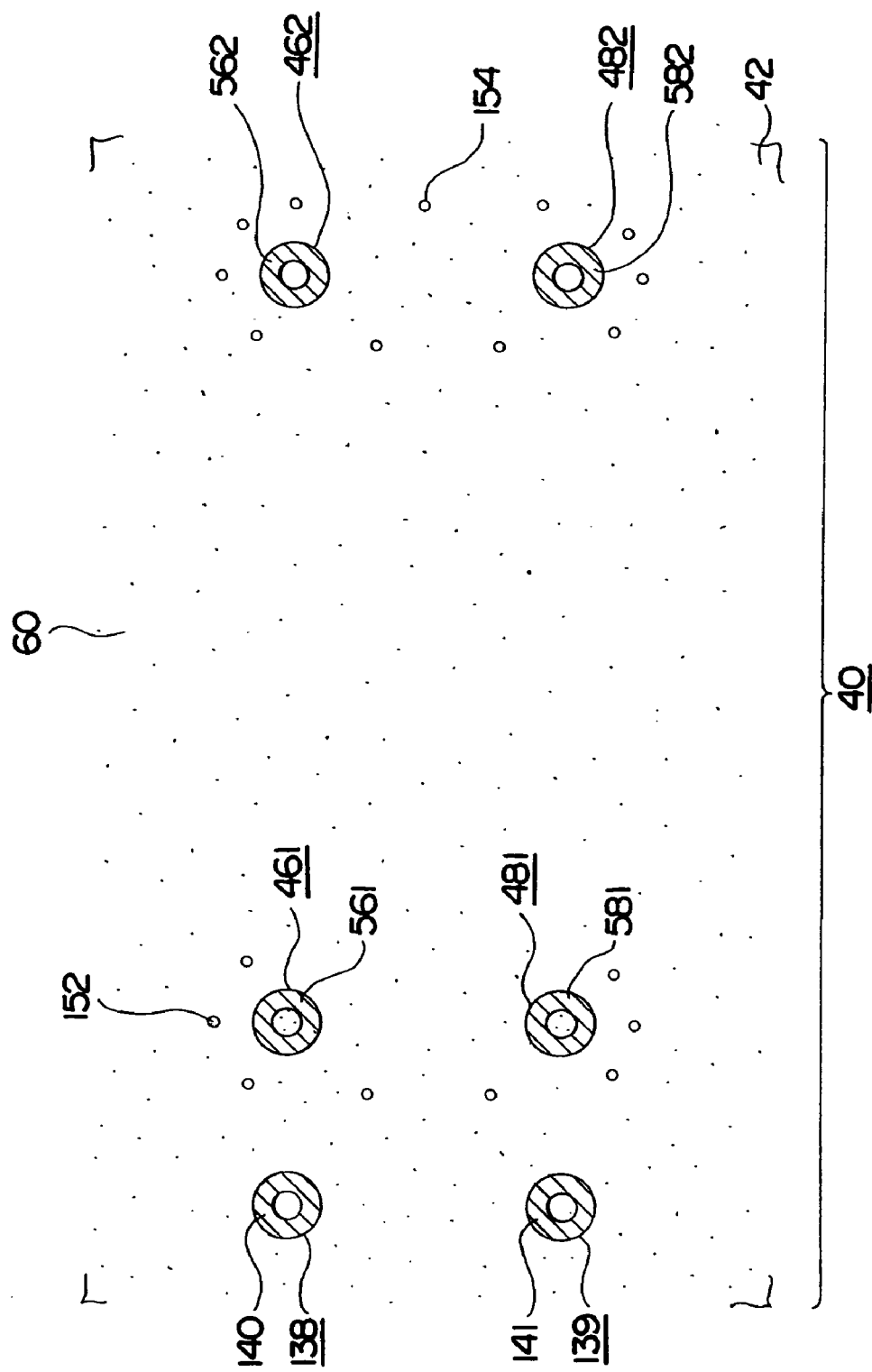
FIG. 22 is a sectional view taken along line XXII-XXII of FIG. 21.
Figure 23:
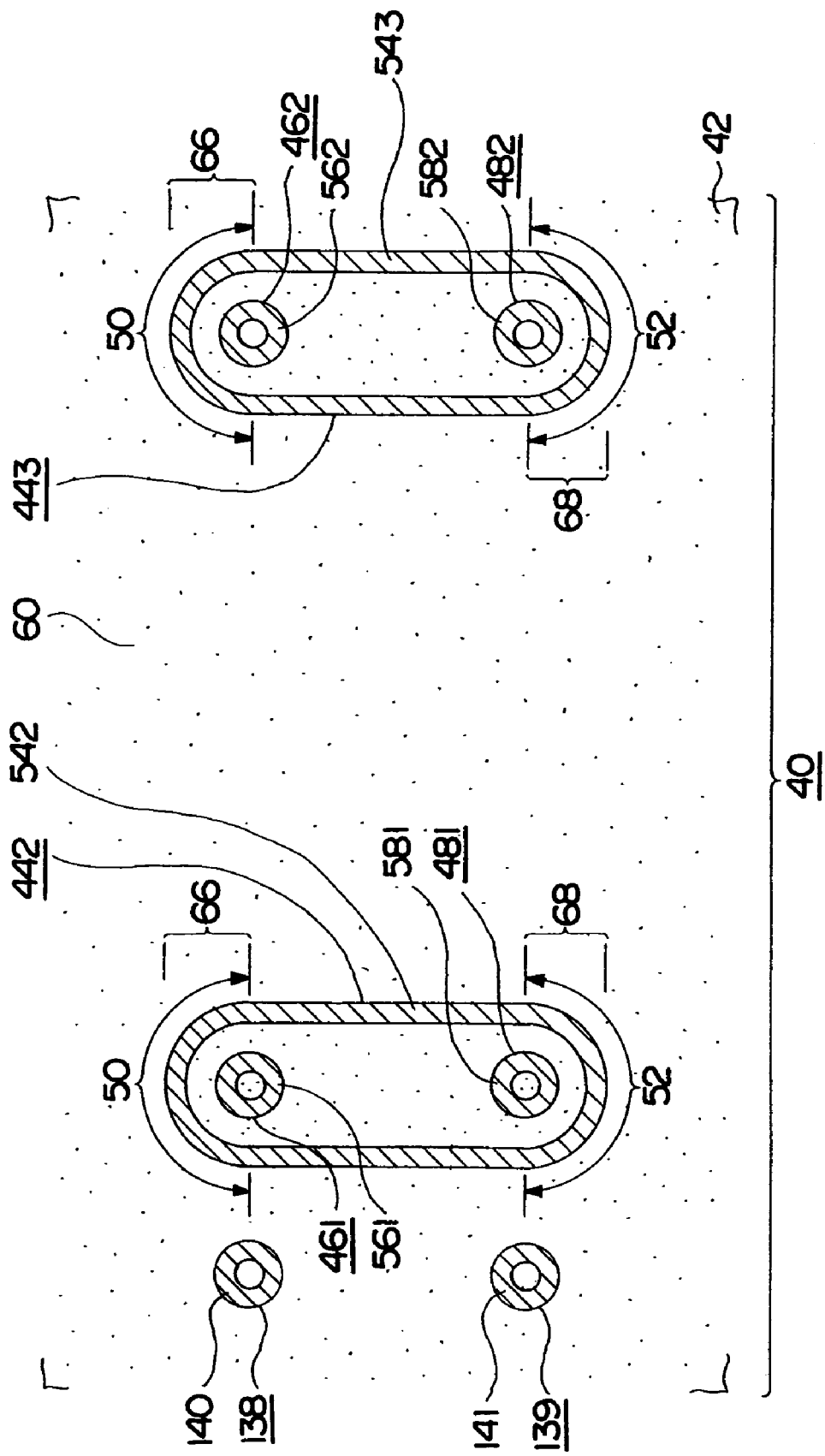
FIG. 23 is a sectional view taken along line XXIII-XXIII of FIG. 21.
Figure 24:
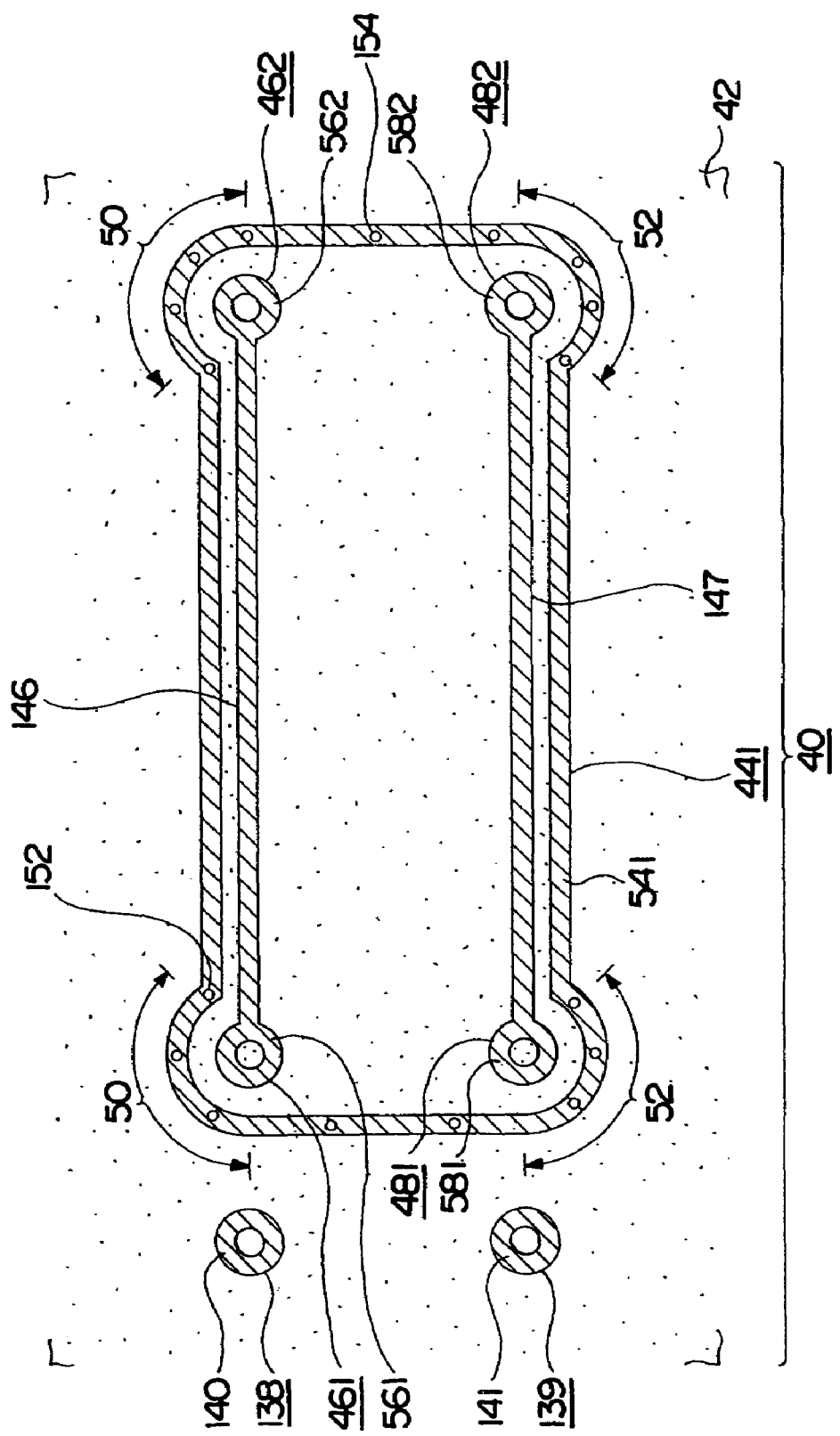
FIG. 24 is a sectional view taken along line XXIV-XXIV of FIG. 21.

The fifth embodiment of the present invention is explained by referring to FIG. 20 through FIG. 24. FIG. 20 is a plan view showing a part of a surface of a wiring base board according to the fifth embodiment, FIG. 21 is a sectional view taken along line XXI-XXI of FIG. 20, FIG. 22 is a sectional view taken along line XXII-XXII of FIG. 21, FIG. 23 is a sectional view taken along line XXIII-XXIII of FIG. 21, and FIG. 24 is a sectional view taken along line XXIV-XXIV of FIG. 21.

This embodiment is a constitution which provides guard pattern parts on a surface part of the wiring base board and also provides a plurality of plural-cored coaxial structure parts.

On a surface part of this wiring base board 40, a first guard pattern part 122 and a second guard pattern part 124 are formed. In a part which is surrounded with the guard pattern part 122, a first wiring pattern 126 and a second wiring pattern 128 are formed. These wiring patterns 126 and 128 constitute differential wiring. For example, the signal of a positive phase side of a differential signal is transmitted by the wiring pattern 126, the signal of an opposite phase side of the differential signal is transmitted by the wiring pattern 128, and both signals can be electromagnetically coupled through the wiring patterns 126 and 128. At one end portion of each of the wiring patterns 126 and 128, via hole parts 461 and 481 described before are formed. A conductor part 561 is provided in the via hole part 461, and a conductor part 581 is provided in the via hole part 481. In this embodiment, the wiring base board 40 is constituted by a multilayer substrate, and, for example, the via hole parts 461 and 481 are constituted by a four-layer non-penetration signal hole. The same insulator as the insulating layer 60 is filled in through hole parts 621 and 641 of the via hole parts 461 and 481, and the via hole parts 461 and 481 are made into a non-air core. On the other hand, at the other end portion of each of the wiring patterns 126 and 128, terminal parts 130 and 132 are formed. To the terminal parts 130 and 132, an electronic component, for example, a passive component such as a connector and an active component such as a transistor, is connected. For example, each of the terminal parts 130 and 132 is formed into a circle and is formed wider than an intermediate portion of the wiring patterns 126 and 128.

Furthermore, in a part surrounded with the guard pattern part 124, via hole parts 462 and 482 are formed. A conductor part 562 is provided in the via hole part 462, and a conductor part 582 is provided in the via hole part 482. In this embodiment, as described before, the wiring base board 40 is constituted by a multilayer substrate, and, for example, the via hole parts 462 and 482 are constituted by an eight-layer penetration signal hole.

According to a constitution like this, since the wiring patterns 126 and 128 constituting differential wiring are surrounded with the guard pattern part 122 and the via hole parts 462 and 482 are surrounded with the guard pattern part 124, these are isolated from an outside by the guard pattern parts 122 and 124. Because of this, for example, if the guard pattern parts 122 and 124 are constituted as a grounded conductor, it is possible to avoid the influence of an external noise to signal transmission of the wiring patterns 126 and 128.

Further, in this wiring base board 40, a plurality of non-through holes 134 are formed in a part of the guard pattern part 122 of the via hole parts 461 and 481 side by drilling holes in a part of the wiring base board 40 in the direction of its thickness. In addition, a plurality of non-through holes 136 are formed in the guard pattern part 124 in a similar manner.

Further, as shown in FIG. 21, in this wiring base board 40, a plurality of first via hole parts 441, 442, 443, 444 and 445 are formed. The via hole parts 442 and 443 are arranged at an upper side of the via hole part 441, and the via hole parts 444 and 445 are arranged at a lower side of the via hole part 441. The via hole part 441 and the via hole parts 442 and 443 are electrically connected at an inside of the wiring base board 40.

Inside of the via hole part 442 the via hole parts 461 and 481 are formed, and inside of the via hole part 443 the via hole parts 462 and 482 are formed. The via hole parts 461 and 481 are surrounded with the via hole part 442, and the via hole parts 462 and 482 are surrounded with the via hole part 443. Along with this, lower side portions of these via hole parts 442 and 443 are surrounded with the via hole part 441 described before. A conductor part 541 is provided in the via hole part 441, a conductor part 542 is provided in the via hole part 442, a conductor part 543 is provided in the via hole part 443, a conductor part 544 is provided in the via hole part 444, and a conductor part 545 is provided in the via hole part 445.

Further, outside of the guard pattern part 122 and the via hole part 441, a pair of via hole parts 138 and 139 for signal transmission is formed. Conductor parts 140 and 141 are provided in each of the via hole parts 138 and 139. These via hole parts 138 and 139 are constituted by an eight-layer penetration signal hole similarly to the via hole parts 462 and 482. For example, a guard pattern part similar to the guard pattern part 122 of the upper face side may also be provided in a bottom face side of the wiring base board 40.

Furthermore, the conductor part 541 of the via hole part 441 and the conductor part 545 of the via hole part 445 are connected. The conductor part 542 of the via hole part 442 and the conductor part 543 of the via hole part 443 are electrically connected by a conductor layer 144, and are made into the same potential. Further, the conductor part 561 of the via hole part 461 and the conductor part 562 of the via hole part 462 are electrically connected by a conductor layer 146, and signal transmission is performed between the two of them. The conductor part 542 of the via hole part 442 and the conductor part 140 of the via hole part 138 are electrically connected by a conductor layer 148. Along with this, the conductor part 544 of the via hole part 444 and the conductor part 140 of the via hole part 138 are electrically connected by a conductor layer 150. In addition, the conductor part 544 of the via hole part 444 and the conductor part 545 of the via hole part 445 are electrically connected by a conductor layer 152. By these, the conductor parts 541, 542, 543, 544 and 545 of each of the via hole parts 441, 442, 443, 444 and 445 are designed to be made into the same potential. In addition, at a lower side of the via hole part 461, a via hole part 463 surrounded with the via hole part 444 is provided. This via hole part 463 is constituted by a conductor part 563. Further, a conductor part 141 (FIG. 20) of the via hole part 139 is electrically connected to another conductor part similarly to the conductor part 140 of the via hole part 138, and the conductor part 141 and the conductor part to which the conductor part 141 is connected are designed to be made into the same potential.

Further, as shown in FIG. 22, in a circumference of the via hole parts 461 and 481, a plurality of conductor parts 152 are provided correspondingly to the guard pattern part 122. By these conductor parts 152, the conductor part 542 of the via hole part 442 and the guard pattern part 122 are connected and are made into the same potential. In a circumference of the via hole parts 462 and 482, a plurality of conductor parts 154 are provided correspondingly to the guard pattern part 124, and, through these conductor parts 154, the conductor part 543 of the via hole part 443 and the guard pattern part 124 are connected and are made into the same potential. Therefore, a guard pattern part corresponding to the guard pattern part 122 is formed at a lower face side of the wiring base board 40, and thereby, it may also be made into the same potential similarly to the guard pattern part 122. In this case, the non-through holes 134 and 136 are constituted by the conductor parts 152 and 154.

Further, as shown in FIG. 23, the via hole parts 442 and 443 constitute an elliptic ring-shaped body, respectively. Inside of the via hole part 442 the via hole parts 461 and 481 are formed, and the inside of the via hole part 443 the via hole parts 462 and 482 are formed. As described in the first embodiment, by this constitution, each of the conductor parts 561 and 581 of the via hole parts 461 and 481 constitutes the differential wiring which couples electromagnetically, and, similarly, each of the conductor parts 562 and 582 of the via hole parts 462 and 482 also constitutes the differential wiring which couples electromagnetically. Further, the conductor part 542 of the circumferential face parts 50 and 52 of the via hole part 442 and the conductor parts 561 and 581 of the via hole parts 461 and 481 constitute respectively the coaxial structure, and the conductor part 543 of the circumferential face parts 50 and 52 of the via hole part 443 and the conductor parts 562 and 582 of the via hole parts 462 and 482 constitute respectively the coaxial structure.

Furthermore, as shown in FIG. 24, inside of the via hole part 441, the via hole parts 461, 481, 462 and 482 are formed. Each of the conductor parts 561 and 562 of the via hole parts 461 and 462 is connected by the conductor layer 146, each of the conductor parts 581 and 582 of the via hole parts 481 and 482 is connected by a conductor layer 147, and the conductor layers 146 and 147 are electromagnetically coupled and are made into differential wiring similarly to the via hole parts 461 and 481 or the via hole parts 462 and 482. In addition, a coaxial structure is constituted at the circumferential face parts 50 and 52 between the via hole part 441 and the via hole parts 461 and 481 or the via hole parts 462 and 482.

Like this, according to this embodiment, in the surface part of the wiring base board 40, a barrier is constituted by surrounding the wiring patterns 126 and 128, the via hole parts 461, 481, 462 and 482, and so on, with the guard pattern parts 122, 124, 142 and so on. Along with this, inside of the wiring base board 40 forming a multilayer substrate, the before-described via hole structures of a double structure are given. By this, making into the differential wiring and the coaxial structures is designed to be given. Because of this, the stability against an external noise is heightened, and the working and effect similar to the first, second, fourth and fifth embodiments can be obtained. In addition, it is possible to produce the wiring base board of this embodiment by using the producing method described in the third embodiment.

Sixth Embodiment

Figure 25:
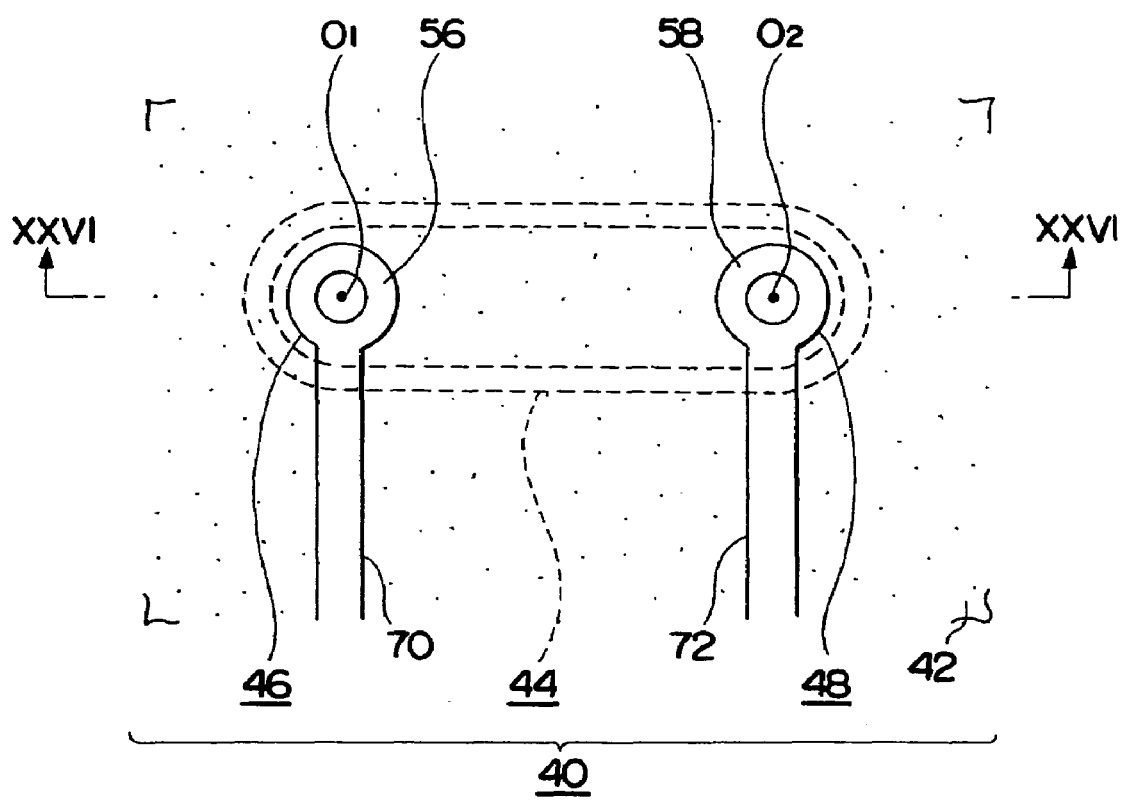
FIG. 25 is a plan view showing a part of a surface of a wiring base board according to the sixth embodiment of the present invention.
Figure 26:
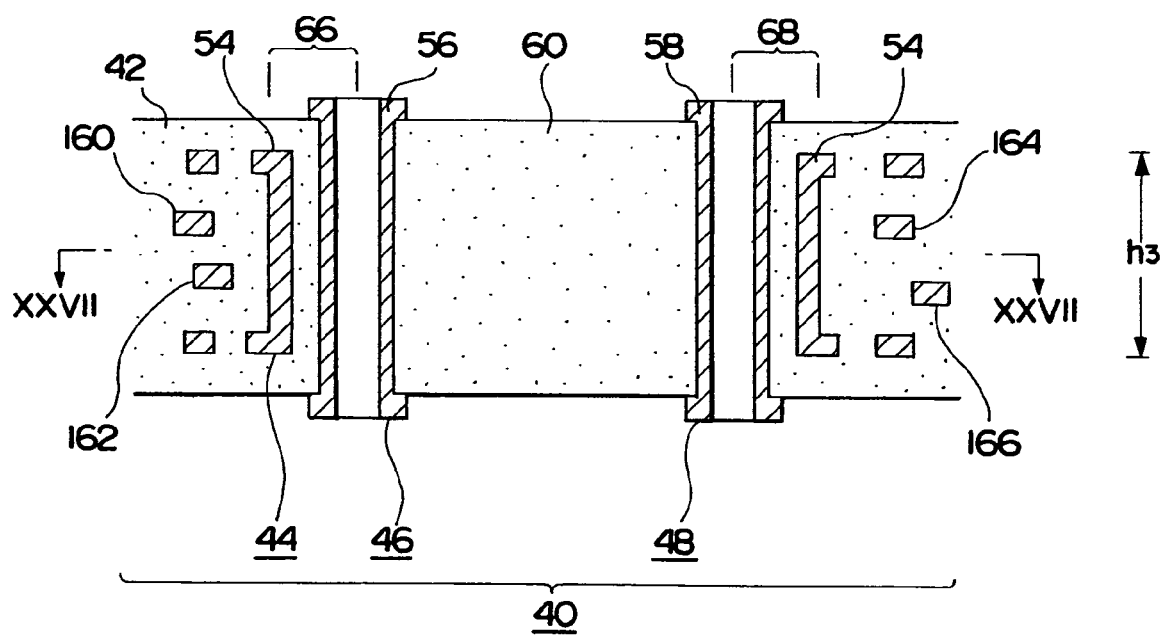
FIG. 26 is a sectional view taken along line XXVI-XXVI of FIG. 25.
Figure 27:
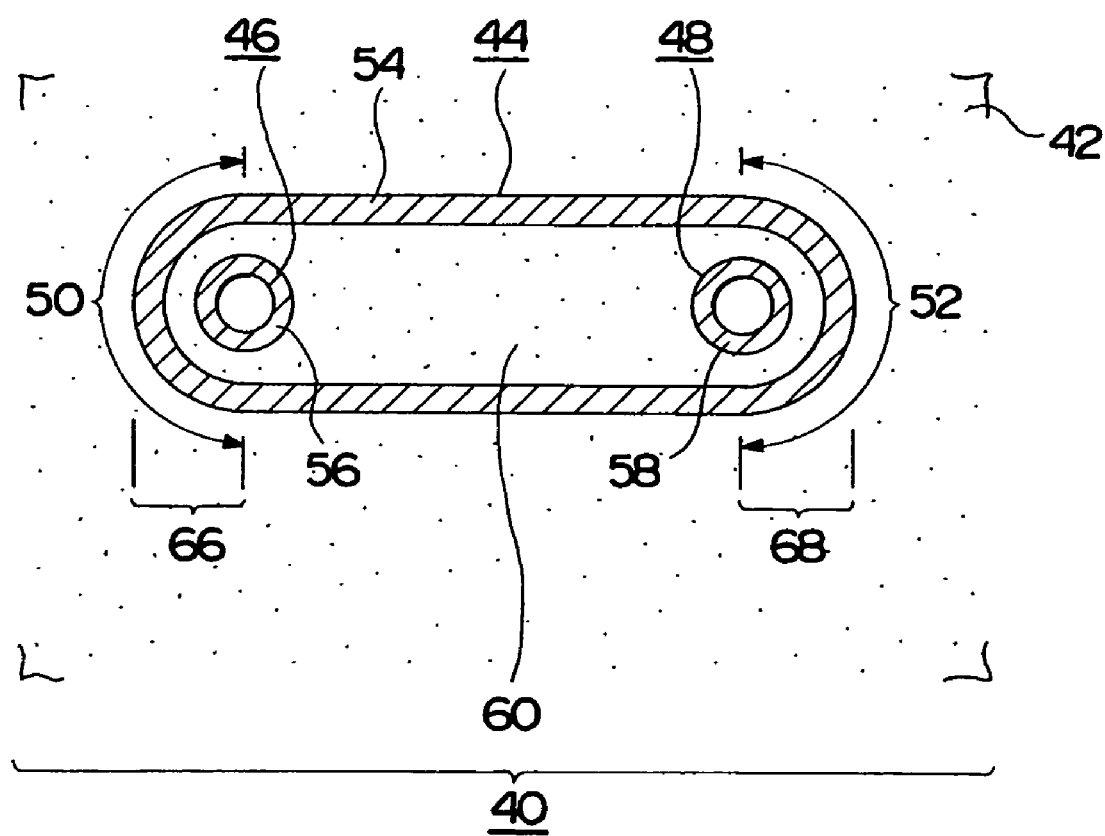
FIG. 27 is a sectional view taken along line XXVII-XXVII of FIG. 26.

The sixth embodiment of the present invention is explained by referring to FIG. 25 through FIG. 27. FIG. 25 is a plan view showing a part of a surface of a wiring base board according to the sixth embodiment, FIG. 26 is a sectional view taken along line XXVI-XXVI of FIG. 25, and FIG. 27 is a sectional view taken along line XXVII-XXVII of FIG. 26. In this embodiments, the same potions as those of the first and second embodiments are indicated by the same reference numerals.

In this embodiment, a conductor part of a via hole part is constituted by a plurality of core layers, each wiring pattern is provided at a part of each core layer, and the diversity of signal transmission is realized.

In this wiring base board 40, similarly to the first and the second embodiments, via hole parts 46 and 48 are provided inside a via hole part 44. A ring-shaped conductor part 54 of the via hole part 44 surrounds the via hole parts 46 and 48, but conductor parts 160, 162, 164, 166 and so on are formed in a part of the substrate 42 corresponding to a width h3 of the conductor part 54 as wiring patterns of plural layers. These conductor parts 160, 162, 164 and 166 are used as a lot of signal transmission lines within the width h3. Such a constitution is signal transmission lines which are constituted by using the substrate 42 composed of an insulating material for the core layer parts.

According to a constitution like this, by the wiring base board 40 being constituted by the substrate 42 composed of an insulating material, it is possible to constitute the core layer parts as various signal transmission lines, and to give the improvement of integration and high density of wiring density and signal lines per a substrate area.

Seventh Embodiment

Figure 28:
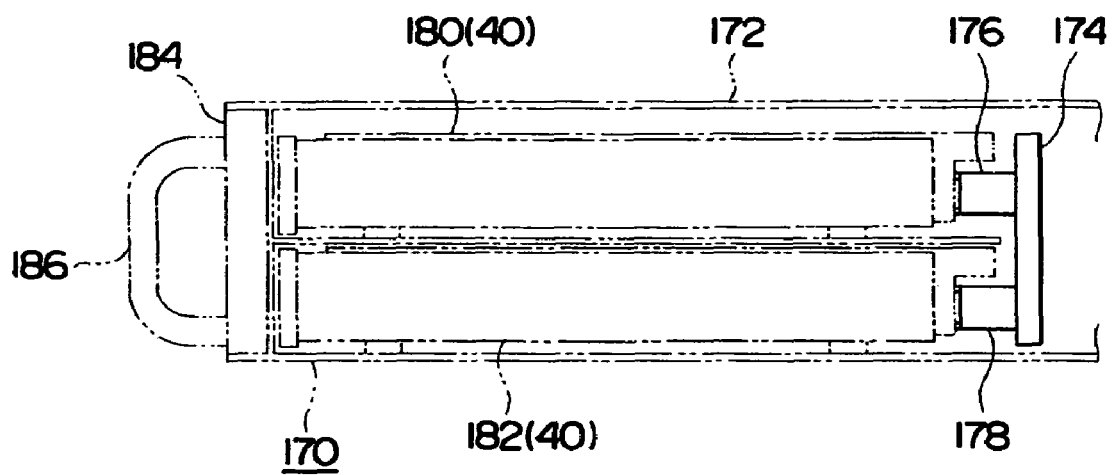
FIG. 28 is a drawing showing a wiring base board unit and an electronic device according to the seventh embodiment of the present invention.

The seventh embodiment of the present invention is explained by referring to FIG. 28. FIG. 28 is a drawing showing a wiring board unit and an electronic device according to the seventh embodiment.

In this embodiment, a wiring board unit or a back panel unit is constituted by using the wiring base board described before, or an electronic device is constituted by using the wiring base board.

In this embodiment, an electronic device 170 such as a disk array device of a rack-mounted type is constituted. Inside of a casing part 172 of this electronic device 170, a back panel 174 using the wiring base board 40 is arranged. On this back panel 174, connectors 176 and 178 are mounted. A hard disk unit, wiring board units 180 and 182 including the wiring base board 40, and so on are connected through the connectors 176 and 178. To a front panel part 184, a handle 186 is provided.

According to a constitution like this, in the electronic device, by the before-described differential wiring structure and coaxial structure of the wiring base board 40, it is possible to perform high-speed signal transmission by making into the differential wiring, and the stability against an external noise is also heightened. Because of this, it is possible to constitute a device with high reliability.

Eighth Embodiment

Figure 29:
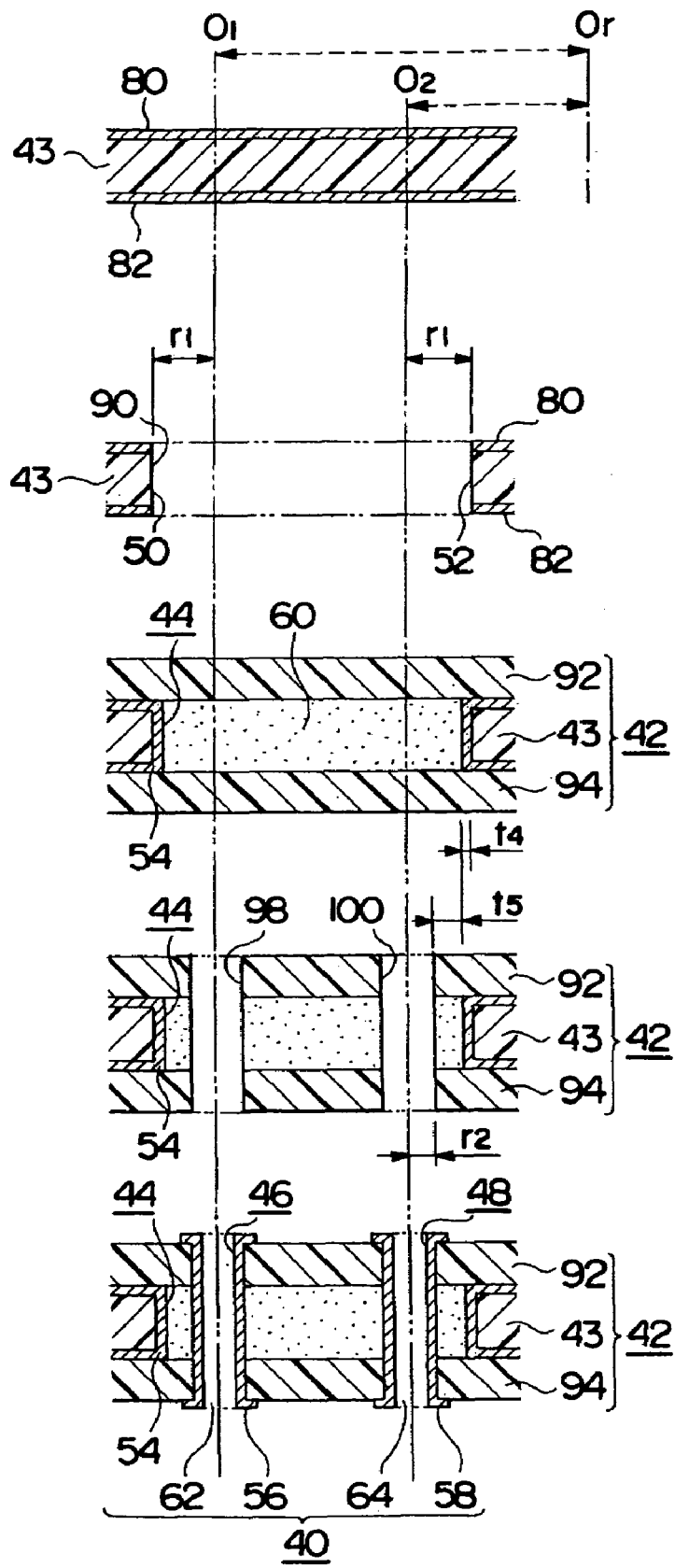
FIG. 29 is sectional views showing a producing method of a wiring base board according to the eighth embodiment of the present invention.
Figure 30:
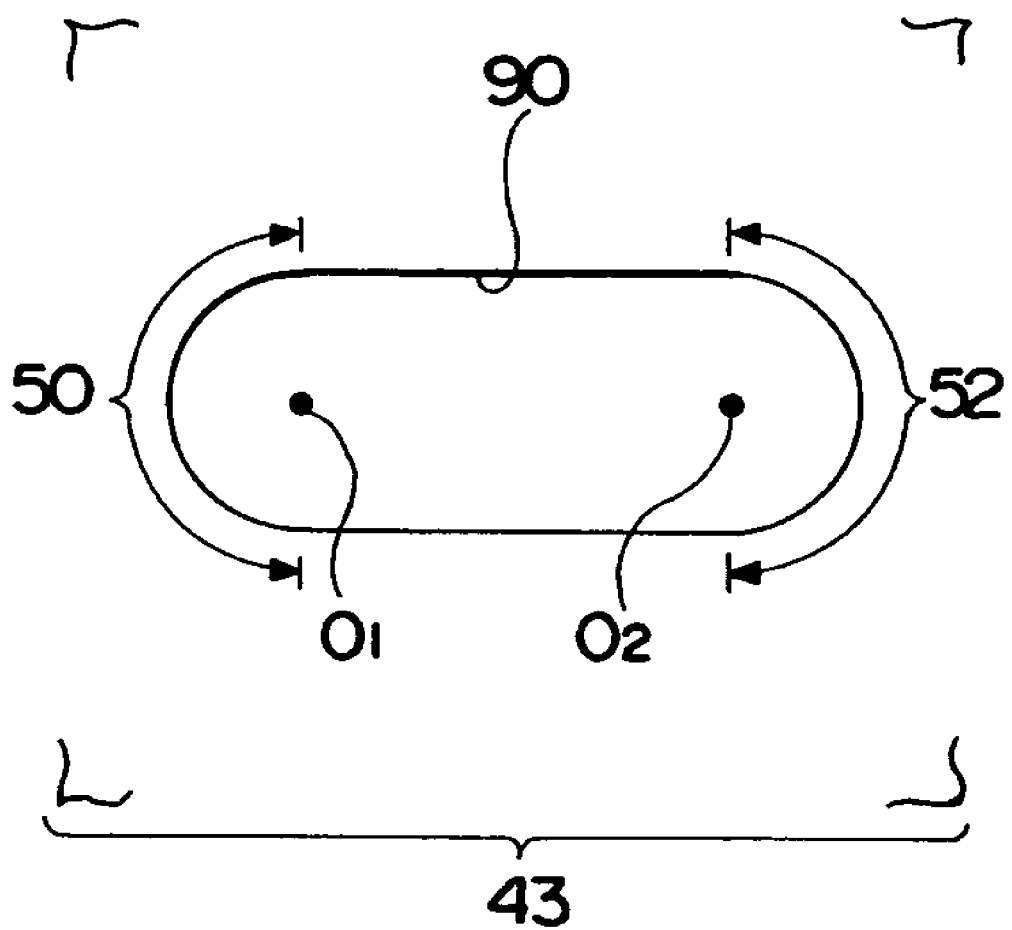
FIG. 30 is a drawing showing a drilling process in the producing method of a wiring base board.

The eighth embodiment of the present invention is explained by referring to FIG. 29 and FIG. 30. FIG. 29 is sectional views showing a producing method of a wiring base board according to the eighth embodiment, and FIG. 30 is a plan view showing a drilling process. In FIG. 29, the same portions as those of the third embodiment (FIGS. 15 and 16) are indicated by the same reference numerals.

In the third embodiment described before, the producing method in which, after forming the two circular holes, the elliptic hole is formed by cutting off the portion between the circular holes is described. However, instead of a plurality of processes like this, the elliptic-shaped through hole part 90 may also be formed by omitting formation of the circular holes as pre-treatment.

In this case, as shown in FIG. 29A, the substrate 43 which is formed by an insulating material is used, and the wiring patterns 80 and 82 composed of conductor layers are formed on the surface and back face of the substrate 43. The reference axis Or is set by positioning the substrate 43, and, along with this, the central axes O1 and O2 to form the via hole parts 44, 46 and 48 are set. Each of the central axes O1 and O2 is set by using the reference axis Or as a standard. These points are the same as the third embodiment.

By making each of the central axes O1 and O2 a center, for example, the elliptic-shaped through hole part 90 is formed by a router process. The router process is performed by using a cutting edge like an end mill in machine work. According to such a process, as shown in FIG. 30, the elliptic-shaped through hole part 90 is directly formed without performing a drilling process of circles in the substrate 43.

In addition, since processes in relation to the via hole parts 44, 46 and 48 are the same as the third embodiment (FIG. 15), these processes are omitted by giving the same reference numerals to the drawings.

According to a producing method like this, drilling processes of a plurality of steps become useless. Along with this, it is possible to prevent a decline of producing accuracy due to a gap of dimensional accuracy in case in which the via hole part 44 and the via hole parts 46 and 48 are set by using different central axes.

In connection with the embodiments mentioned above, modified examples are enumerated in the following.

(1) The following constitution may also be given. That is, a coaxial structure is not made between the via structures which are paired, but a double structure is constituted by providing a GND wall so as to cover the whole of vias which are paired.

(2) In the above-mentioned embodiments, the constitution in which the via hole parts constituting the differential wiring are provided inside the ring-shaped conductor part of the via hole part is exemplified. However, the wiring base board of the present invention may also have a via hole part which performs signal transmission except the differential transmission.

(3) In the above-mentioned embodiments, the wiring base board of a four-layer structure and an eight-layer structure is exemplified. However, the present invention can be applied to various kinds of wiring base boards such as a printed circuit base board of a multilayer structure which exceeds eight layers or is under the eight layers, or to method of producing thereof, and is not limited to an exemplified layer structure.

Although the best mode for carrying out the invention, the object, the configuration and the operation and effect have been described in detail above, the invention is not limited to such embodiment for carrying out the invention, and it is a matter of course that the invention can be variously changed or modified by a person skilled in the art on the basis of a gist and split of the invention as disclosed in claims and the detailed description of the invention, and such a change or modification, and various conjectured configurations, modified examples and so forth are included in the scope of the invention, and the description of the specification and drawings are not restrictively understood.

The entire disclosure of Japanese Patent Application No. 2004-140253 including specification, claims, drawings and summary are incorporated herein by reference in its entirety.

What is claimed is:

1. A producing method of a wiring base board, comprising:
forming a plurality of holes each of which having a different central axis in an insulating substrate, and by using a part of an inner circumferential face of each of the holes as a plurality of circumferential face parts, forming a first via hole part partially having the circumferential face parts at an inner face;
filling an insulator into said first via hole part; and
forming a plurality of second via hole parts forming concentric circles with said circumferential face parts by using each central axis of the plurality of holes, which are set to form said circumferential face parts, in common.

2. The producing method of claim 1 further comprising:
forming a first conductor part in said first via hole part; and
forming second conductor parts in said second via hole parts.

3. A producing method of a wiring base board, comprising:
forming a plurality of holes each of which having a different central axis in an insulating substrate, and by using a part of an inner circumferential face of each of the holes as a plurality of circumferential face parts, forming a first via hole part partially having the circumferential face parts at an inner face;
filling an insulator into said first via hole part; and
forming a plurality of second via hole parts forming concentric circles with said circumferential face parts by using each central axis of the plurality of holes, which are set to form said circumferential face parts, in common, a part of an outer circumferential face of each of the second via hole parts being formed to be opposite to a corresponding circumferential face part of the first via hole parts at an equal distance.

* * * * *